United States Patent
Cho et al.

(10) Patent No.: US 7,348,653 B2
(45) Date of Patent: Mar. 25, 2008

(54) RESISTIVE MEMORY CELL, METHOD FOR FORMING THE SAME AND RESISTIVE MEMORY ARRAY USING THE SAME

(75) Inventors: Byeong-Ok Cho, Seoul (KR); Moon-Sook Lee, Seoul (KR); Takahiro Yasue, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 35 days.

(21) Appl. No.: 11/279,640

(22) Filed: Apr. 13, 2006

(65) Prior Publication Data

US 2007/0029546 A1 Feb. 8, 2007

(30) Foreign Application Priority Data

Apr. 19, 2005 (KR) ...................... 10-2005-0032470

(51) Int. Cl.
*H01L 27/01* (2006.01)

(52) U.S. Cl. ...................... 257/516; 365/100; 365/148; 257/537; 257/E27.006; 257/E27.016; 257/E27.025; 257/E27.035; 257/E27.047; 257/E27.071; 257/E27.101; 257/E21.007; 257/E21.294; 257/E21.496; 438/238; 438/384; 438/FOR. 189; 438/FOR. 212

(58) Field of Classification Search ................ 257/516, 257/537, E27.006, E27.025, E27.035, E27.047, 257/E27.071, E27.101, E21.007, E21.294, 257/E21.496; 365/100, 148; 438/238, 384, 438/FOR. 189

See application file for complete search history.

(56) References Cited

U.S. PATENT DOCUMENTS

| | | | |
|---|---|---|---|
| 4,392,209 A * | 7/1983 | DeBar ...................... 365/110 |
| 5,272,359 A * | 12/1993 | Nagasubramanian et al. ........................... 257/40 |
| 6,055,180 A * | 4/2000 | Gudesen et al. ............ 365/175 |
| 6,834,008 B2 | 12/2004 | Rinerson et al. |
| 7,211,856 B2* | 5/2007 | Sezi et al. .................. 257/310 |
| 2003/0076649 A1* | 4/2003 | Speakman ................... 361/524 |
| 2005/0111252 A1* | 5/2005 | Bednorz et al. ............ 365/154 |
| 2005/0111256 A1* | 5/2005 | Bednorz et al. ............ 365/177 |
| 2005/0146955 A1* | 7/2005 | Kajiyama ................... 365/202 |
| 2005/0179033 A1* | 8/2005 | Walter et al. .................. 257/40 |
| 2005/0180189 A1* | 8/2005 | Happ et al. .................. 365/145 |
| 2005/0186737 A1* | 8/2005 | Sezi et al. .................. 438/257 |

(Continued)

FOREIGN PATENT DOCUMENTS

JP 2003-068983 3/2003

(Continued)

OTHER PUBLICATIONS

Ouyang, Jianyong, et al, "Programmable Polymer Thin Film and Non-Volatilve Memory Device", Nature Materials: vol. 3, Dec. 2004, pp. 918-922.*

(Continued)

*Primary Examiner*—George Fourson
(74) *Attorney, Agent, or Firm*—Marger Johnson & McCollom, P.C.

(57) ABSTRACT

A resistive memory cell employs a photoimageable switchable material, which is patternable by actinic irradiation and is reversibly switchable between distinguishable resistance states, as a memory element. Thus, the photoimageable switchable material is directly patterned by the actinic irradiation so that it is possible to fabricate the resistive memory cell through simple processes, and avoiding ashing and stripping steps.

30 Claims, 16 Drawing Sheets

U.S. PATENT DOCUMENTS

| | | | |
|---|---|---|---|
| 2005/0212022 A1* | 9/2005 | Greer et al. | 257/296 |
| 2005/0287698 A1* | 12/2005 | Li et al. | 438/102 |
| 2006/0046344 A1* | 3/2006 | Liljedahl et al. | 438/99 |
| 2006/0175604 A1* | 8/2006 | Ufert | 257/40 |
| 2006/0181317 A1* | 8/2006 | Joo et al. | 327/148 |
| 2006/0234418 A1* | 10/2006 | Ufert | 438/99 |
| 2007/0029546 A1* | 2/2007 | Cho et al. | 257/40 |
| 2007/0176629 A1* | 8/2007 | Lee et al. | 326/37 |
| 2007/0194288 A1* | 8/2007 | Lee et al. | 252/500 |
| 2007/0197768 A1* | 8/2007 | Choi et al. | 528/395 |

FOREIGN PATENT DOCUMENTS

| | | |
|---|---|---|
| JP | 2004-128486 | 4/2004 |
| KR | 1998-051020 | 9/1998 |
| KR | 2001-0034466 | 4/2001 |

OTHER PUBLICATIONS

English language abstract of Japanese Publication No. 2003-068983.

English language abstract of Japanese Publication No. 2004-128486.

* cited by examiner

RESISTIVE MEMORY CELL, METHOD FOR FORMING THE SAME AND RESISTIVE MEMORY ARRAY USING THE SAME

CROSS-REFERENCE TO RELATED APPLICATIONS

This U.S. non-provisional patent application claims priority under 35 U.S.C. §119 of Korean Patent Application 2005-32470 filed on Apr. 19, 2005, the entire contents of which are hereby incorporated by reference.

BACKGROUND OF THE INVENTION

1. Field of the Invention

The present invention relates to a memory device, and more particularly, to a resistive memory cell, a method of forming the same, and a resistive memory array using the same.

2. Description of the Related Art

Generally, a process of forming a semiconductor includes a thin film deposition process, a diffusion process, an oxidation process, an ion implantation process, a photolithographic process, an etching process, and so forth. Among these processes, the photolithographic process includes forming a photoresist pattern on a substrate. The photoresist pattern corresponds to a circuit pattern that has been designed in advance. An exposed underlying thin film is etched using the photoresist pattern formed on the substrate as an etch mask so that the circuit pattern is transferred to the thin film of the substrate.

The photolithographic process for forming the photoresist pattern on the substrate includes a coating process of a photoresist material, an exposure process, and a development process. The photoresist material exposed to light is photochemically changed, and thus, an exposed portion and a non-exposed portion of the photoresist material have structures chemically different from each other. Therefore, by using an appropriate developing solution, one of the two portions is selectively removed, and the other portion, which is not removed by the developing solution, becomes a photoresist pattern.

The photoresist pattern formed by the exposure and development process is removed by an ashing process, a stripping process, or the like, after it has been used as an etch mask for etching underlying layers. The ashing is a process of removing the photoresist pattern using oxygen plasma in a plasma etching apparatus, and the stripping is a process of removing the photoresist pattern at about 125° C. using a mixed solution of sulfuric acid and an oxidant. In removing the photoresist pattern, the photoresist pattern should be removed as fast as possible, without effecting the underlying pattern.

A problem with respect to the process of removing the photoresist pattern will be set forth with regard to the fabrication of a memory cell.

Recently, attempts have been made to fabricate a resistive memory cell by employing an organic material as a memory element. FIG. 1 schematically illustrates a cross-point memory array employing an organic material as the memory element. Referring to FIG. 1, in the organic memory cell array, a plurality of parallel upper electrodes 15 intersect a plurality of parallel lower electrodes 11. Between the upper electrodes 15 and the lower electrodes 11, an organic thin film 13, which acts as an memory element, is disposed. Therefore, a unit memory cell is configured with the upper electrode 15, the lower electrode 11, and the organic material 13 disposed at an intersection region of the upper and the lower electrodes 15 and 11. A method of forming the cross-point memory array of FIG. 1 includes: forming the lower electrode 11; forming the organic thin film 13; depositing a conductive layer for the upper electrode; and patterning the conductive layer to thereby form the upper electrode 15. The patterning of the conductive layer for the upper electrode 15 requires a photolithographic process and a photoresist pattern removal process such as an ashing or a stripping process.

To highly integrate the resistive memory cells using the organic material, it is very important for the memory element such as the organic material to have thermal, mechanical and chemical stability without deterioration, even after performing the photolithographic process and the photoresist pattern removal process as state above.

However, the organic material used as the memory element is apt to deteriorate during the photolithographic process and the photoresist removal process, because the ashing process is a high temperature oxidation process using energy of plasma particles and reactive radicals, and the stripping process is performed using a chemical solution. The deterioration of the organic material due to the photoresist removal process causes the operational characteristics of the resistive memory cell to deteriorate also. For example, such deteriorated operational characteristics include ambiguity to distinguish between two resistance states, or an increased leakage current, or that a high voltage is required for a switching operation, or the like.

Moreover, if the organic thin film used as the memory element is not separated into every memory cell, then a leakage current may occur between neighboring memory cells. This may be a limiting factor in increasing the degree of integration.

SUMMARY OF THE INVENTION

Exemplary embodiments of the present invention provide a method of forming a resistive memory cell having a resistive memory element.

Exemplary embodiments of the present invention also provide a memory cell using a "photoimageable switchable material" as a memory element which can be patterned by actinic irradiation and can be reversibly switchable between distinguishable resistance states.

The "photoimageable switchable material" of the present invention may be an arbitrary material which can be directly patterned by actinic irradiation using light, an electron beam, or the like, and may also be reversibly switchable between distinguishable resistance states by an applied electrical signal. The applied electrical signal for switching the photoimageable switchable material, for example, may be a voltage, a current, or the like. The electrical signal may be applied to the photoimageable switchable material through two opposite electrodes connected to the photoimageable switchable material. For instance, the photoimageable switchable material may have predetermined resistance states of which one state is distinguishable from the other state according to polarity or magnitude of the applied voltage.

The photoimageable switchable material of the present invention is patterned by direct exposure and development processes without employing a photoresist, and inherently without a process for removing a photoresist pattern. In addition, the patterned photoimageable switchable material may be used as a memory element. Therefore, according to the present invention, because there is no need to perform an ashing, a stripping and so on, for removing a photoresist pattern unlike the prior art, it is possible to form a photoimageable switchable memory element pattern without causing deterioration.

In some embodiments of the present invention, the photoimageable switchable memory element pattern may be formed in about 1,000 nm thick or less by exposing and developing the photoimageable switchable material after spin-coating the photoimageable switchable material on a substrate where the electrode is formed.

In other embodiments, the photoimageable switchable material may be formed by mixing or chemically reacting a switching organic polymer and a photosensitizer with each other, wherein the photosensitizer is a photoacid generator or a photoacid compound. The switching organic polymer may be a polymer which is directly patternable by the actinic irradiation using the light, the electron beam, or the like. For example, although it is not limited to the following materials, the switching organic polymer includes tetracyanoquinodimethane, poly[3-(6-methoxyhexyl)thiopene], Rose Bengal, and poly(3,4-ethylenedioxythiophene), etc.

In further embodiments, the photoimageable switchable material may be formed by uniformly dispersing a switching component into a photoimageable organic polymer. The switching component provides a basis for switching characteristics. Although it is not limited to the following materials, the switching component, for example, includes a nanoparticle, a metal ion, or a metal salt. Furthermore, though it is not limited to the following materials, the nanoparticle includes a metallic nanoparticle, a conductive polymer nanoparticle, a conductive organic nanoparticle, or an organic/inorganic hybrid nanoparticle, of which size is about 100 nm or smaller. Herein, the metallic nanoparticle may be aluminum, copper, nickel, iron, cobalt, gold, silver, magnesium, indium, calcium, lithium, a conductive metallic oxide, or the like. The conductive polymer nanoparticle may be 3,4-polyethylene dioxy-thiophenepolystyrene-sulfonate, doped polyaniline, or the like. The conductive organic nanoparticle may be buckminster fullerene, dendrimer, carbon nanotube, or the like. The organic/inorganic hybrid nanoparticle may be a particle in which alkyl thiol encompasses the metallic nanoparticle, the conductive polymer nanoparticle, or the conductive organic nanoparticle. The metal salt can be decomposed into a positive ion and a negative ion when a predetermined voltage is applied thereto. Although it is not limited to the following, the metal salt includes sodium chloride, sodium cesium, or the like. Although it is not limited to the following, the metal ion includes aluminum, copper, silver, gold, nickel, chrome, titanium, tantalum, zinc, tin, or the like.

In yet further embodiments, $Cu(BF_4)_2$ may be used as a precursor for a copper ion. The photoimageable switchable material may be formed by mixing $Cu(BF_4)_2$ with the photoimageable organic polymer using an appropriate solvent such as tetra hydrofuran.

In some embodiments, the photoimageable organic polymer may be a material which can be directly patternable by the actinic irradiation using light, an electron beam, or the like. For example, the photoimageable organic polymer is an organic polymer having the photosensitizer such as the photoacid generator and photoacid compound. It is preferable that the organic polymer be a heat resistant organic polymer having a glass transition temperature of about 100° C. or higher. Although it is not limited to the following materials, the organic polymer includes an insulating polymer such as polyimide, polyamide, polymethylmethacrylate, poly benzoxazol, poly styrene, poly carbonate, polyolefin, polyester, polyurethane, polyacetal, polysilicon, poly sulfonate, or the like, and a semiconductor polymer such as poly(phenylenevinylene), poly thiophene, polyacetylene, poly(p-phenylene), polyaniline, poly-pyrrole, polyfluorene, poly(p-phenylene), a derivative thereof and a copolymer thereof. The photosensitizer is mixed or chemically reacted with the organic polymer so that a main chain or a side chain of the organic polymer is appropriately changed. As a result, photoimageable organic polymer is formed.

An exposed photoimageable switchable material may be different in chemical structure from a non-exposed photoimageable switchable material because chemical crosslinking may occur by means of the photosensitizer in the exposed photoimageable switchable material. Accordingly, the non-exposed portion of the photoimageable switchable material may be selectively removed using an appropriate developing solution, but the exposed portion remains intact, to thereby form a memory element pattern. And vice versa, the exposed portion may be selectively removed but the non-exposed portion may remain intact to form the memory element pattern.

In further embodiments, the resistive memory cell further includes a switching organic polymer between the photoimageable switchable material and the substrate in which the electrode is formed. The switching organic polymer, for example, is formed by dispersing the switching component into the organic polymer, as described above. At this time, the underlying switching organic polymer is patterned using the photoimageable switchable memory element pattern formed by the exposure and development as an etch mask. Both the patterned switching organic polymer and the photoimageable switchable memory element pattern act as a memory element.

In yet other embodiments of the present invention, the photoimageable switchable memory element pattern is formed by exposing, developing and performing a heat treatment over the photoimageable organic polymer after forming the photoimageable organic material on the substrate having the electrode through a spin-coating process. Herein, the heat treatment is performed before or after the development process. As a result, a nanocluster layer is formed providing switching characteristics at an interface between the electrode and the photoimageable organic polymer layer. The heat treatment, for example, is performed at about 300° C. or higher. Herein, an organic polymer layer is additionally formed between the photoimageable organic polymer layer and the substrate in which the electrode is formed. At this time, the nanocluster layer is formed between the organic polymer layer and the electrode. In addition, the underlying organic polymer layer and nanocluster layer are patterned using the photoimageable organic polymer material layer pattern formed by the exposure and development as an etch mask.

In yet further embodiments of the present invention, the photoimageable switchable memory element pattern is formed by exposing and developing a photoimageable organic thin film and a metal thin film providing switching characteristic after depositing the photoimageable organic thin film and the metal thin film on the substrate having the electrode at least one time. Herein, considering that the uppermost photoimageable switchable organic polymer thin film can be used as an etch mask, it may not be necessary for the organic polymer thin film on other layers except the uppermost photoimageable switchable organic polymer thin film to have photoimageable characteristic. Furthermore, if performing the heat treatment additionally, nanoparticles are formed at an interface between the photoimageable switchable organic polymer thin film and the metal thin film.

Two electrodes of the resistive memory cell for applying a voltage or a current to the photoimageable switchable memory element pattern may be formed of various materials and by various methods.

In some embodiments, although it is not limited to the following materials, each of the two electrodes is formed of aluminum (Al), copper (Cu), titanium nitride (TiN), titanium aluminum nitride (TiAlN), iridium (Ir), platinum (Pt), silver (Ag), gold (Au), polycrystal silicon, tungsten (W), and so on.

In other embodiments, a lower electrode of the resistive memory cell is formed having a predetermined shape before forming the photoimageable switchable memory element pattern. Alternatively, the lower electrode of the resistive memory cell may be formed by an etching process using the photoimageable switchable memory element pattern as an etch mask after forming the photoimageable switchable memory element pattern. Meanwhile, an upper electrode of the resistive memory cell may be formed after forming the switchable memory element pattern.

In yet other embodiments, the lower electrode of the resistive memory cell may be formed by performing the etching process using the photoimageable switchable memory element pattern as the etch mask after depositing a conductive material. That is, the conductive material for the lower electrode is deposited, and then photoimageable switchable memory element lines are formed on the conductive material, wherein the photoimageable switchable memory element lines extend in a first direction and they are spaced apart from each other. The exposed conductive material for the lower electrode is patterned using the photoimageable switchable memory element lines as an etch mask, to form lower electrode lines. After forming a planar polymer material, upper electrode lines, which are spaced apart form each other, are formed extending in a second direction, wherein the upper electrode lines intersect the lower electrode lines and the photoimageable switchable memory element lines. Thus, a cross-point memory array is formed in which a unit resistive memory cell is defined at every location where the upper and lower electrode lines intersect each other. The planar polymer material may be formed of a material having excellent thermal resistant and mechanical, chemical, and electrical stability. For example, the planarizing polymer material is formed of an insulating layer having polyimide, polyamide, polymethylmethacrylate, poly benzoxazol, poly styrene, poly carbonate, polyolefin, polyester, polyurethane, polyacetal, polysilicon, or poly sulfonate. The planar polymer material may be formed by a spin coating process so that a top surface is planarized without any supplementary planarization process, wherein the planar polymer material fills the space between the lower electrode lines and the photoimageable switchable memory element lines. Furthermore, the planar polymer material has excellent thermal resistant and mechanical, chemical, and electrical stability so that it protects the photoimageable switchable memory element lines during the photolithographic process, the ashing process, and the stripping process. Herein, the planar polymer material formed at the portion where the upper electrode line and the photoimageable switchable memory element line intersect each other, is formed very thinly. However, the planar polymer material formed between neighboring photoimageable switchable memory element lines is formed thicker than the planar polymer material formed at the portion where the upper electrode line and the photoimageable switchable memory element line intersect each other. That is, the thickness of the planar polymer material formed between the neighboring photoimageable switchable memory element lines is as thick as the lower electrode line and the v memory element line. Therefore, since the planar polymer material formed between the neighboring photoimageable switchable memory element lines is thick enough, it does not provide a switching function so that one memory cell does not disturb other memory cells adjacent thereto during the operation.

In some embodiments, the planar polymer material may not be formed. In this case, the upper electrode line is formed so that it encompasses the photoimageable switchable memory element lines completely. That is, the upper electrode may be formed so that it covers the top surface and the side surface of the photoimageable switchable memory element line. Therefore, the photoimageable switchable memory element lines are protected from the photolithographic process, the ashing process, and the stripping process for forming the upper electrode. Instead of the planar polymer material, the photoimageable material layer may be formed. In this case, the photoimageable material layer is directly patterned to form via holes exposing the photoimageable switchable memory element lines, and a conductive material for the upper electrode is patterned to form the upper electrode lines after forming the conductive layer on interiors of the via holes and the photoimageable material layer. The photoimageable material layer is formed by a spin coating process so that a top surface thereof may be planarized without any supplementary planarization process, wherein the photoimageable material layer fills the space between the lower electrode lines and the photoimageable switchable memory element lines. Moreover, since the photoimageable material layer remains after being patterned, the ashing and stripping processes are not performed over the patterned photoimageable material layer. In addition, the remaining patterned photoimageable material layer protects the photoimageable switchable memory element line during the photolithographic process, the ashing process, and the stripping process.

In other embodiments of the present invention, it is possible to form a multi-level cross-point memory array by stacking repeatedly the structure configured with a lower electrode, a memory element pattern and an upper electrode. The multi-level cross-point memory array includes: multi-level electrode lines with interposing an insulating layer between adjacent levels, adjacent levels of electrode lines intersecting each other and electrode lines in the same level being parallel; and a photoimageable switchable memory element line disposed between respective electrode lines and the insulating layer, the photoimageable switchable memory element line being substantially same shape as the electrode line.

In yet other embodiments, the insulating layer may be a planar polymer layer or a photoimageable material layer. If the insulating layer is the photoimageable material layer, the electrode lines formed on the photoimageable material layer fills a via hole of the photoimageable material layer to be connected to the photoimageable switchable memory element line.

In further embodiments, at least one of the two electrodes of the resistive memory cell, e.g., the lower electrode, is formed in a shape of a plug. The lower electrode plug is formed by forming contact holes in the insulating layer and subsequently filling the contact holes with conductive material. The filling of the conductive material is achieved by depositing the conductive material and planarizing it. After forming the lower electrode plug, the photoimageable switchable memory element lines are formed on the insulating layer to be connected to the lower electrode plugs, wherein the photoimageable switchable memory element lines are arranged in the first direction. After forming the planarizing polymer material, the upper electrode lines, which are spaced apart from each other, are formed on the planar polymer material, wherein the upper electrode lines extend in the second direction, and intersect the memory element lines. Herein, the planar polymer material may not be formed. In this case, the upper electrode is formed so that it covers the photoimageable switchable memory element lines and the insulating layer. Alternatively, instead of the planar polymer material, a photoimageable material layer such as photoresist may be formed. In this case, the photoimageable material layer is patterned to form via holes exposing the photoimageable switchable memory element lines, and a conductive material for the upper electrode line is patterned to form the upper electrode lines after forming the conductive layer on interiors of the via holes and the photoimageable material layer.

In yet further embodiments, the lower electrode plugs are connected to a drain (or source) of a select transistor, wherein a source (or drain) of the select transistor is connected a source line (or a drain line). This memory array is fabricated using a conventional CMOS process with ease. That is, the select transistors are formed through the conventional MOS process. Thereafter, the source line to be connected to the sources of the select transistors is formed, and then the lower electrode plugs, the memory element lines and the upper electrode lines are formed using the aforementioned methods.

In some embodiments, the lower electrode lines arranged in the first direction are connected to a conductive line. The conductive line and the memory element line extend in the first direction, and are connected to each other through the lower electrode plug. The upper electrode line extends in the second direction, and intersects with the memory element line at the position wherein the lower electrode plugs are formed. This cross-point memory array does not require the select transistor.

In other embodiments, at least one of the two electrodes of the resistive memory cell, e.g., the lower electrode, is formed by a damascene process. That is, a line groove defining the lower electrode is formed by patterning the insulating layer. Afterwards, the line groove is filled with the conductive material to form the lower electrode. Thereafter, the photoimageable switchable memory element pattern is formed using the method as stated above.

BRIEF DESCRIPTION OF THE DRAWINGS

The accompanying drawings, which are included to provide a further understanding of the invention and are incorporated in, and constitute a part, of this application, illustrate embodiments of the invention, and together with the description serve to explain the principle of the invention. In the drawings:

FIGS. 9A and 9B are cross-sectional views of a memory array employing the memory cell of FIGS. 4A to 4D, wherein FIG. 9A is a cross-sectional view taken along a word line, and FIG. 9B is a cross-sectional view taken along a bit line;

FIGS. 11A and 11B are cross-sectional views of a memory array employing the memory cell of FIGS. 5A to 5D, wherein FIG. 11A is a cross-sectional view taken along a word line, and FIG. 11B is a cross-sectional view taken along a bit line;

DETAILED DESCRIPTION OF THE INVENTION

Figure 1:
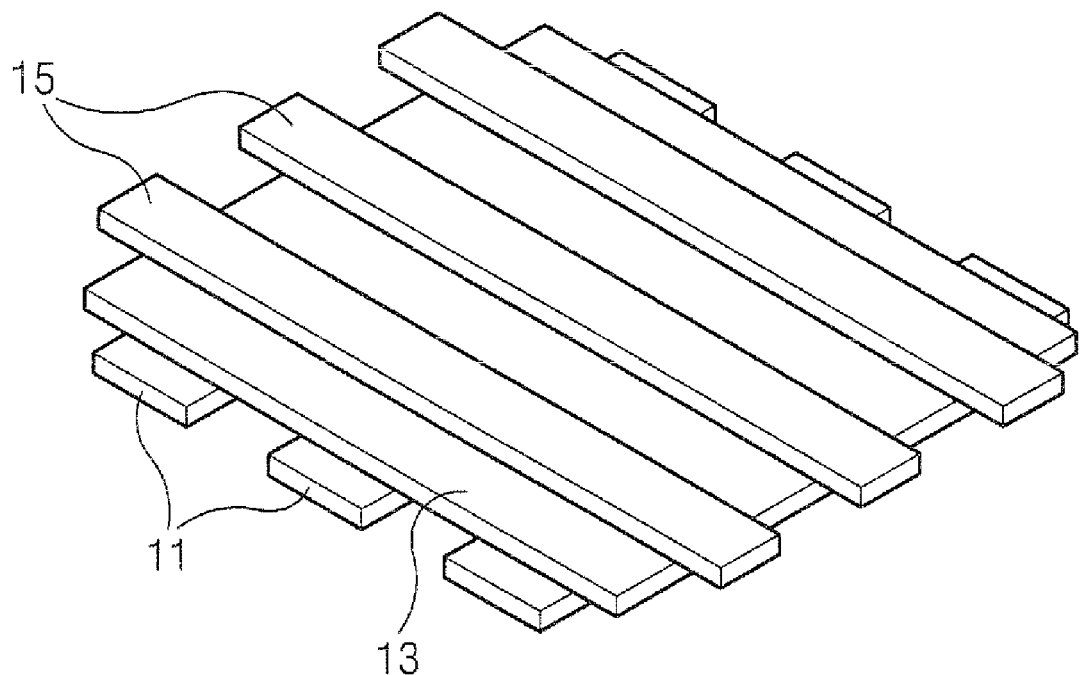
FIG. 1 is a perspective view of a conventional organic memory cell array.

Reference will now be made in detail to the preferred embodiments of the present invention, examples of which are illustrated in the accompanying drawings. However, the present invention is not limited to the embodiments illustrated herein after, and the embodiments herein are rather introduced to provide easy and complete understanding of the scope and spirit of the present invention. In the drawings, the thicknesses of layers (including electrodes, thin films, layers, lines, and patterns) and regions are exaggerated for clarity. It will also be understood that when a layer is referred to as being "on" another layer or substrate, it can be directly on the other layer or substrate, or intervening layers may also be present. Like reference numerals in the drawings denote like elements, and thus their description will be omitted. Although terms "a first", "a second", "a third", and so forth, are used for describing various regions, layers or the like, the regions and the layers should not be construed as being limited to these terms. In addition, theses terms are only used for distinguishing a predetermined region or layer from another region or layer. Therefore, "a first layer" in one embodiment may be referred to as "a second layer" in another embodiment.

A "substrate" used in this specification may include an arbitrary structure based on a semiconductor having an exposed semiconductor surface thereof. It should be understood that this structure may include a silicon, a silicon-on-insulator (SOI), a silicon-on-sapphire (SOS), a doped silicon, an undoped silicon, an epitaxial layer supported by a base semiconductor layer, or another semiconductor structure. In addition, it is not necessary for the semiconductor to be based on the silicon, but the semiconductor may be silicon-germanium, germanium, germanium arsenide, or the like. Furthermore, when referring to the substrate, it may be the substrate obtained by performing predetermined semiconductor processes, in which a region, a conductive layer, an insulating layer, or patterns thereof, and junction regions have been formed.

In this specification, the term "switchable" in front of a certain thin film, layer, material, line or pattern means that the thin film, layer, material, line or pattern can be reversibly switchable between distinguishable resistance states by means of an applied voltage. Furthermore, the term "photoimageable" in front of a certain thin film, layer or material means that the thin film, layer or material can be patterned into a predetermined configuration directly by an actinic irradiation and a development. Additionally, the term "photoimageable" is also used to differentiate a pattern formed by irradiating an actinic beam and developing a photoimageable film, layer or material from a conventional pattern formed by etching a layer using a photoresist pattern.

Fabrication of Photoimageable Switchable Material

In the exemplary embodiments of the present invention, a memory element of a resistive memory cell is formed using a photoimageable switchable material. The photoimageable switchable material of the present invention is based on an organic polymer. The organic polymer includes an insulating polymer such as polyimide, polyamide, polymethylmethacrylate, poly benzoxazol, poly styrene, poly carbonate, polyolefin, polyester, polyurethane, polyacetal, polysilicon, poly sulfonate, or the like, and a semiconductor polymer such as poly(phenylenevinylene), poly thiophene, polyacetylene, poly(p-phenylene), polyaniline, poly-pyrrole, polyfluorene, poly(p-phenylene), derivative thereof, and copolymer thereof. Considering that the fabrication process of the semiconductor is performed in a thermal environment, it is preferable to use a heat resistant organic polymer.

To pattern the organic polymer through the actinic irradiation and development processes, a photosensitizer is added into the organic polymer. In addition, nanoparticles, metal ions or metal salts are added into the organic polymer so that the organic polymer may have a switching characteristic. The photosensitizer such as photoacid generator or a photoacid compound, is mixed or chemically reacted with the organic polymer so that a main chain or a side chain of the organic polymer is appropriately modified. As a result, photoimageable organic polymer may be formed. Meanwhile, by dispersing the nanoparticles, the metal ions, or the metal salts into the organic polymer using an appropriate solvent, the switchable organic polymer may be formed. The nanoparticles include metallic nanoparticles, conductive polymer nanoparticles, conductive organic nanoparticles, or organic/inorganic hybrid nanoparticles, with sizes of about 100 nm or smaller. Herein, the metallic nanoparticles may be aluminum, copper, nickel, iron, cobalt, gold, silver, magnesium, indium, calcium, lithium, a conductive metallic oxide, or the like. The conductive polymer nanoparticles may be 3,4-polyethylene dioxy-thiophenepolystyrene-sulfonate, doped polyaniline, or the like. The conductive organic nanoparticles may be buckminster fullerene, dendrimer, carbon nanotube, or the like. The organic/inorganic hybrid nanoparticles are particles in which alkyl thiol encompasses the metallic nanoparticles, the conductive polymer nanoparticles, or the conductive organic nanoparticles. However, they are not limited to these nanoparticles. The metal salt can be decomposed into a positive ion and a negative ion when a predetermined voltage is applied thereto. Although it is not limited to the following, the metal salt may include sodium chloride, sodium cesium, or the like. The metal ions may include aluminum, copper, silver, gold, nickel, chrome, titanium, tantalum, zinc, tin, or the like. The metal ions are not limited to the above.

By dispersing the nanoparticles, the metal ions, or the metal salts into the photoimageable organic polymer formed by the above method, it is possible to form the photoimageable switchable organic polymer. Alternatively, the photoimageable switchable organic polymer may be formed by mixing or chemically reacting the photosensitizer with the switchable organic polymer.

After forming the photoimageable switchable organic polymer on the substrate using spin-coating or the like, a photoimageable switchable memory element pattern with a desired shape may be formed by performing the actinic irradiation and development processes.

In another method, by alternately stacking the photoimageable material layer and a thin conductive layer such as a metal thin film on the substrate, it is possible to form the photoimageable switchable material. Thereafter, through the actinic irradiation and development processes, the photoimageable switchable memory element pattern with the desired shape may be formed. Since the conductive layer is formed thinly, it is removed by the developing solution for a photoimageable material layer. However, if not, the conductive layer may be etched using a photoimageable material pattern as an etch mask after the development process.

In still another method, it is possible for the photoimageable material to have a switching characteristic by performing a heat treatment process after forming the photoimageable material on the substrate. By means of the heat treatment process, a nanocluster layer is formed having switching characteristics at an interface between the photoimageable material layer and the substrate. In consideration that the photoimageable material layer is formed on an electrode, the nanocluster layer may have conductance. Since the heat treatment process is performed at about 300° C. or higher, it is preferable that the photoimageable material layer be formed of a photoimageable heat resistant organic material, as stated above. Likewise, to form the memory element pattern, the actinic irradiation and development processes may be performed. Because the nanocluster layer formed at the interface between the electrode and the photoimageable material layer is very thin, it may be removed during the development process. Thus, although the actinic irradiation process, the development process, and the heat treatment process may be performed in any sequence, it is preferable that the heat treatment process be performed after performing the exposure and development processes. By doing this, the nanocluster layer may be defined through self-alignment at a region where the upper and lower electrodes intersect each other.

Formation of the Memory Cell

The resistive memory cell includes two electrodes for applying an electrical signal to the photoimageable switchable memory element pattern formed by the aforementioned methods. The electrodes may have various shapes formed by various manners. A method of forming a resistive memory cell having various shapes of electrodes will be illustrated with reference to accompanying drawings.

First Embodiment

FIGS. 2A to 2E are cross-sectional views illustrating a method of forming a resistive memory cell according to a first embodiment of the present invention.

Figure 2A:
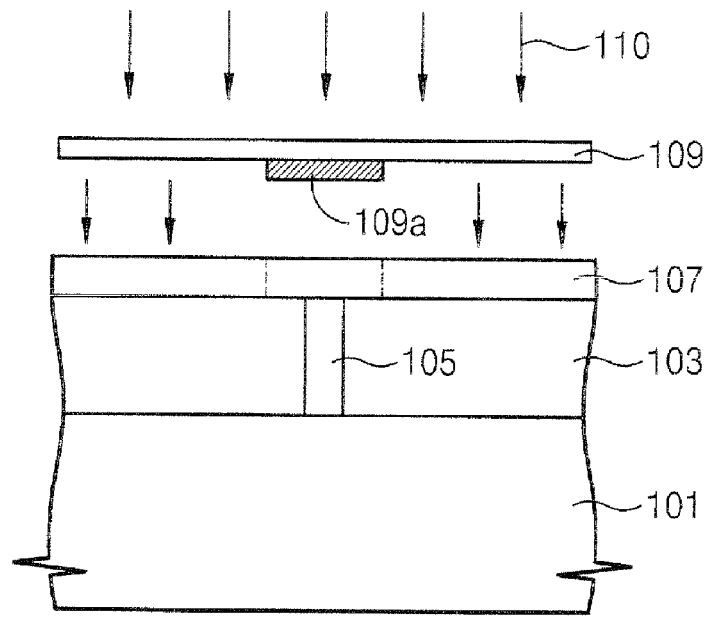
FIGS. 2A to 2E are cross-sectional views illustrating a method of forming a resistive memory cell according to a first embodiment of the present invention.

Referring to FIG. 2A, an insulating layer 103 is formed on a substrate 101. The insulating layer 103 is formed by a well-known thin film deposition process. The insulating layer 103, for example, may be a silicon oxide layer or a multilayer formed by a combination of a silicon oxide layer and a silicon nitride layer. After forming a contact hole in the insulating layer 103 by a photolithographic and etching process, a conductive material is filled into the contact hole to form a first electrode 105. The filling of the conductive material into the contact hole may be achieved by performing a chemical mechanical polishing (CMP) process or an etch-back process after depositing the conductive material. The first electrode 105 may be formed of aluminum (Al), copper (Cu), titanium nitride (TiN), titanium aluminum nitride (TiAlN), iridium (Ir), platinum (Pt), silver (Ag), gold (Au), polycrystal silicon, tungsten (W), and so on.

Still referring to FIG. 2A, a photoimageable switchable material 107 is formed on the insulating layer 103 and the first electrode 105. An actinic beam 110 such as light and an electron beam, is irradiated onto the photoimageable switchable material 107 through a first transparent quartz substrate 109 having an opaque pattern 109a corresponding to a shape of a desired memory element pattern. As a result, a chemical structure difference between a portion irradiated by the actinic beam 110 and a non-irradiated portion in the photoimageable switchable material 107 occurs.

Figure 2B:
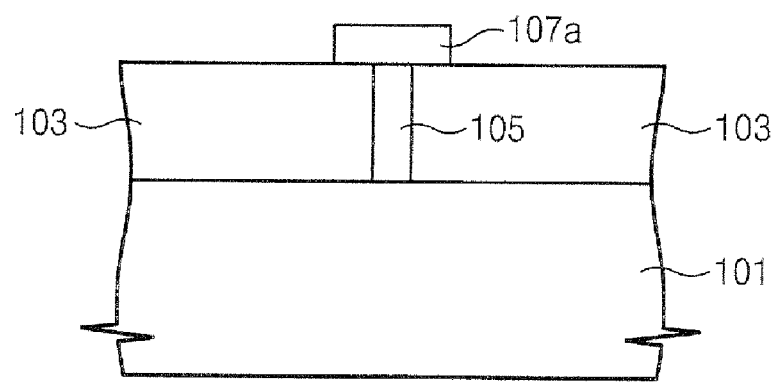

Referring to FIG. 2B, one of the two portions in the photoimageable switchable material 107 is removed using an appropriate developing solution. In the present embodiment of the invention, the irradiated portion is selectively removed to form a memory element pattern 107a which is connected to the first electrode 105. Since the material that can be patterned by itself in virtue of the actinic irradiation is used as the memory element pattern without the use of a photoresist pattern, the memory element pattern 107a is not exposed to ashing and stripping processes, unlike this fundamental requirement in the prior art. The shape of the memory element pattern 107a, which will be discussed in the following illustrations, may be variously determined according to a memory array to be used.

Figure 2C:
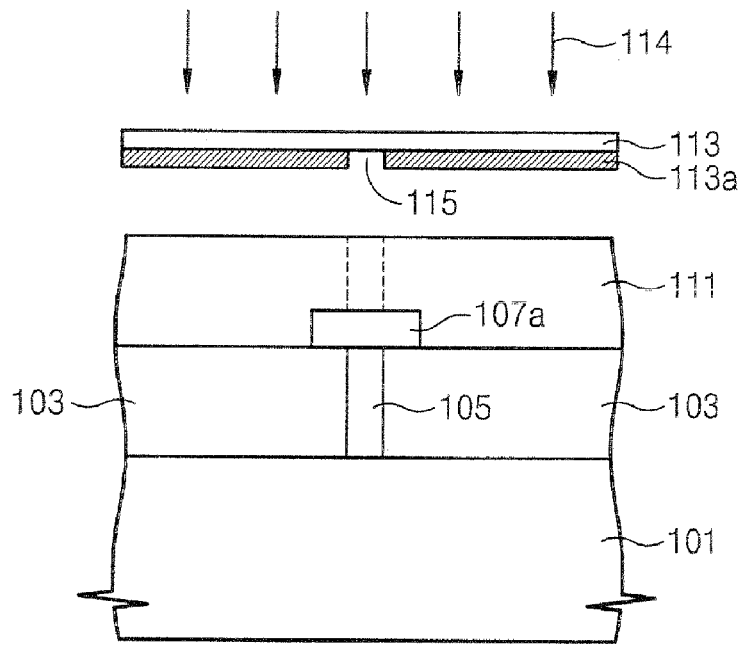

Referring to FIG. 2C, an insulating layer, e.g., a photoimageable material layer 111, which may be patterned directly by actinic irradiation exposure, is formed on the insulating layer 103 to cover the memory element pattern 107a. As stated above, the photoimageable material layer 111 may be formed by mixing or chemically reacting a photosensitizer with an organic polymer. At this time, the photoimageable material layer 111 is formed by a spin coating method or the like so that a top surface thereof is planarized without any supplementary planarization process. Thereafter, an actinic beam 114 is irradiated onto the photoimageable material layer 111 through a second transparent quartz substrate 113 having an opaque pattern 113a to define an opening 115. As a result, a chemical structure difference between a portion irradiated by the actinic beam 114 and a non-irradiated portion in the photoimageable material layer 111 occurs.

Figure 2D:
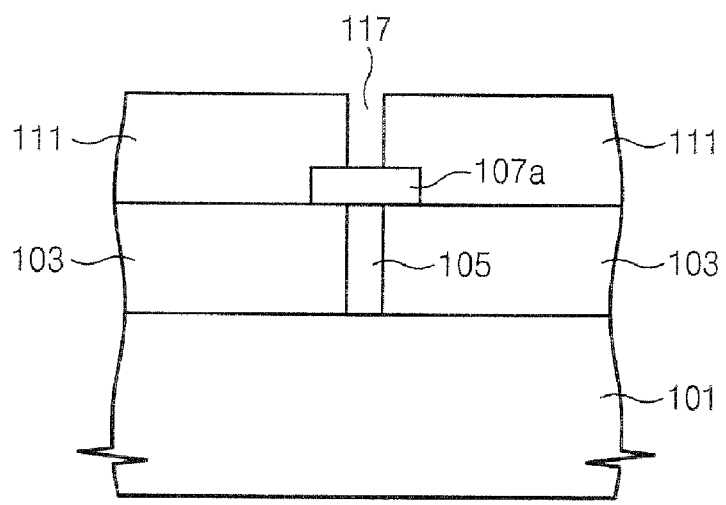

Referring to FIG. 2D, one of the two portions in the photoimageable material layer 111 is removed using an appropriate developing solution. In the present embodiment of the invention, the irradiated portion of the photoimageable material layer 111 is selectively removed to thereby form a contact hole 117 on the photoimageable material layer 111 to expose a predetermined portion of the top surface of the memory element pattern 107a. According to the present embodiment, since the photoimageable material layer 111 is patterned by itself in virtue of the actinic irradiation 114, there is no need to perform ashing and striping processes to expose the memory element pattern 107a by the contact hole 117.

Figure 2E:
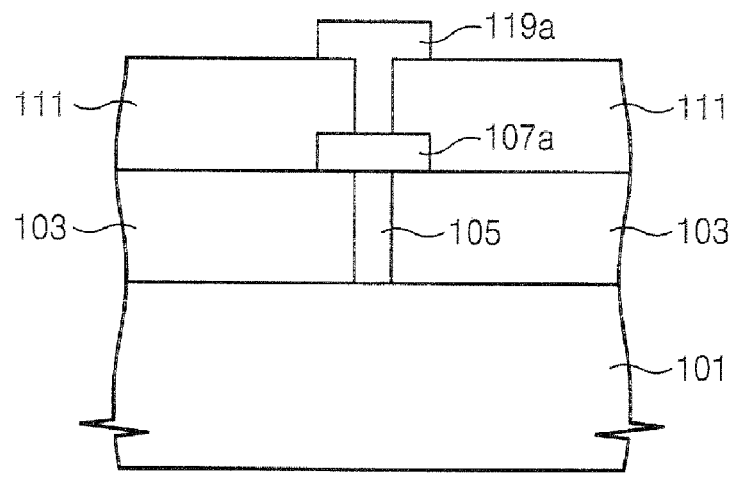

Referring to FIG. 2E, a conductive material for a second electrode is deposited and the conventional photolithographic and etching processes are performed to form a second electrode 119a. Since the memory element pattern 107a is protected by the photoimageable material layer 111, the memory element pattern 107a is protected from the process of etching the conductive layer, including the ashing and stripping processes for removing the photoresist pattern used for forming the second electrode 119a. The second electrode 119a may be formed of aluminum (Al), copper (Cu), titanium nitride (TiN), titanium aluminum nitride (TiAlN), iridium (Ir), platinum (Pt), silver (Ag), gold (Au), polycrystal silicon, tungsten (W), and so on.

Second Embodiment

Figure 3A:
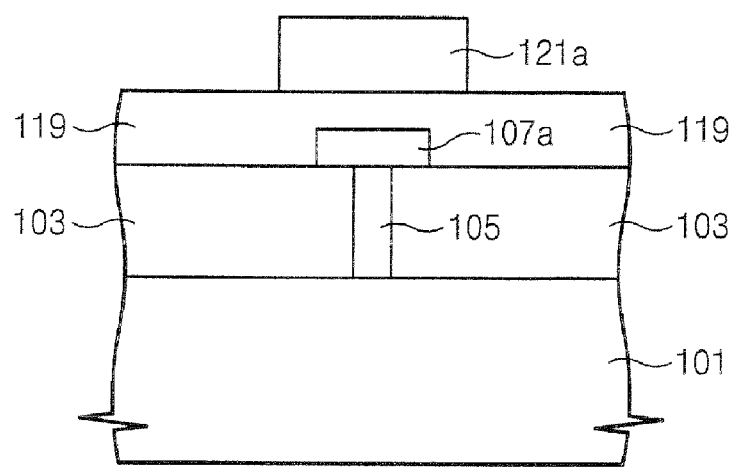
FIGS. 3A and 3B are cross-sectional views illustrating a method of forming a resistive memory cell according to a second embodiment of the present invention.
Figure 3B:
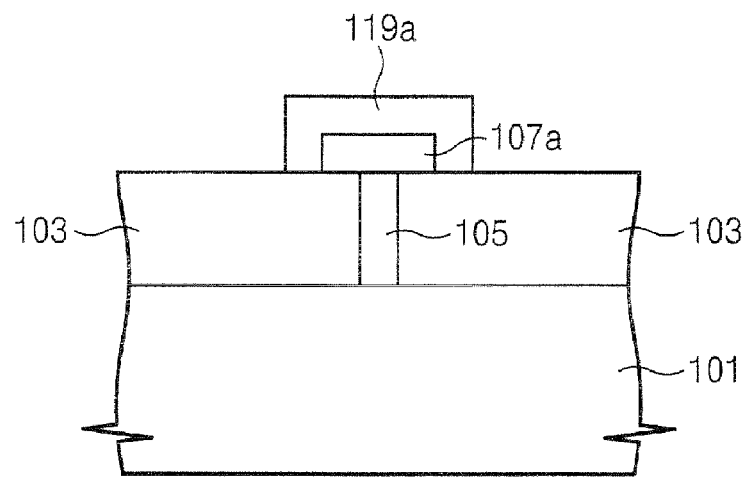

FIGS. 3A and 3B are cross-sectional views illustrating a method of forming a resistive memory cell according to a second embodiment of the present invention.

According to the second embodiment of the present invention, the second electrode 119a is formed so that it covers the side and top surfaces of the memory element pattern 107a. Therefore, the photoimageable material layer 111 will not be formed in comparison with the method illustrated in FIGS. 2A to 2E. This will be explained in the following descriptions.

Referring to FIG. 3A, the processes illustrated in FIGS. 2A and 2B are performed to form a first electrode 105 and a memory element pattern 107a. Thereafter, unlike in the first embodiment, a conductive layer 119 for a second electrode is formed on the insulating layer 103 to cover the memory element pattern 107a without the formation of the photoimageable material layer. The conductive layer 119 is formed of aluminum (Al), copper (Cu), titanium nitride (TiN), titanium aluminum nitride (TiAlN), iridium (Ir), platinum (Pt), silver (Ag), gold (Au), polycrystal silicon, tungsten (W), and so on. Afterward, the conventional exposure and development processes are performed to form a photoresist pattern 121 a on the conductive layer 119. Herein, the photoresist pattern 121a is formed so that its width is greater than that of the memory element pattern 107a.

Referring to FIG. 3B, the exposed conductive layer 119 is etched using the photoresist pattern 121a as an etch mask, to form a second electrode 119a encompassing the memory element pattern 107a.

As in the first embodiment, in the second embodiment, since the material, which can be patterned by itself by actinic irradiation, is used as the memory element pattern, the memory element pattern 107a is not exposed to ashing and stripping circumstances, unlike the prior art.

In the methods of forming the memory cell according to the first and second embodiments, one of the two electrodes, i.e., the first electrode 105, is formed in a shape of a contact plug to fill the contact hole. Meanwhile, a memory array may have various shapes to actually employ the resistive memory cell having this structure. The memory array, for example, may be fabricated with ease using a CMOS process in particular. In some embodiments for the memory array, a unit memory cell includes a select transistor. At this time, a drain (or source) of the select transistor is electrically connected to the first electrode 105, and a source (or drain) is connected a source line (or a drain line). A gate of the select transistor acts as a word line for selecting a specific memory cell while operating the memory array. Meanwhile, the second electrode 119a acts as a bit line. This memory array structure will be illustrated more fully in detail with reference to FIGS. 8 to 11 below.

Third Embodiment

FIGS. 4A to 4D are cross-sectional views illustrating a method of forming a resistive memory cell according to a third embodiment of the present invention.

In the memory cell formed by the third embodiment, the first electrode is not formed in a shape of the contact plug, but it is formed in the same shape as the memory element pattern. In the process for manufacturing this memory cell, the first electrode is formed by performing an etch process using the memory element pattern as an etch mask. Thus, the shape of the memory element can be transferred into the first electrode.

Figure 4A:
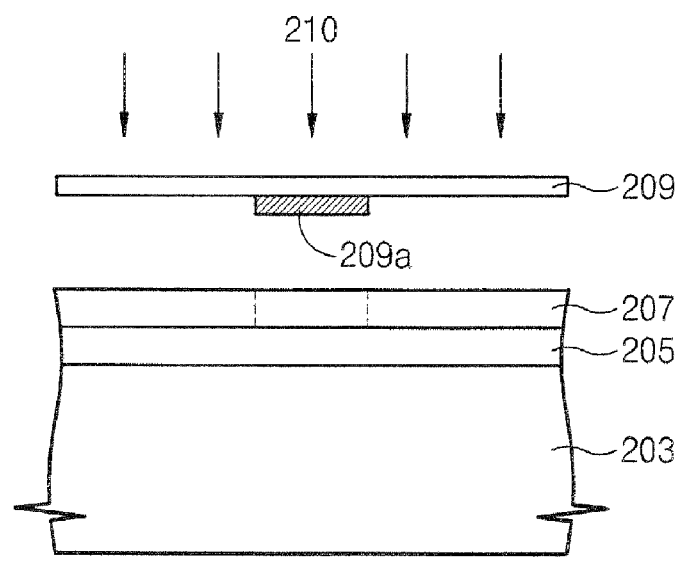
FIGS. 4A to 4D are cross-sectional views illustrating a method of forming a resistive memory cell according to a third embodiment of the present invention.

Referring to FIG. 4A, a first conductive layer 205 for a first electrode is formed on a substrate 203, and a photoimageable switchable material layer 207 for a memory element pattern is formed on the first conductive layer 205. An actinic beam 210 is irradiated on the photoimageable switchable material 207 through a transparent quartz substrate 209 having an opaque pattern 209a corresponding to a shape of a desired memory element pattern. As a result, a chemical structure difference between a portion irradiated by the actinic beam 210 and a non-irradiated portion in the photoimageable switchable material 207 occurs.

Figure 4B:
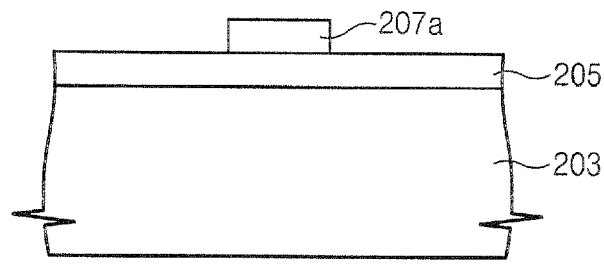

The portion irradiated by the actinic beam 210 is selectively removed using an appropriate developing solution to form a memory element pattern 207a, as illustrated in FIG. 4B. Although it is illustrated that the portion irradiated by the actinic beam is removed by the developing solution, it will be obvious to those skilled in the art that the non-irradiated portion may be removed according to types related to the photosensitivity of the photoimageable switchable material, or a kind of the developing solution.

Figure 4C:
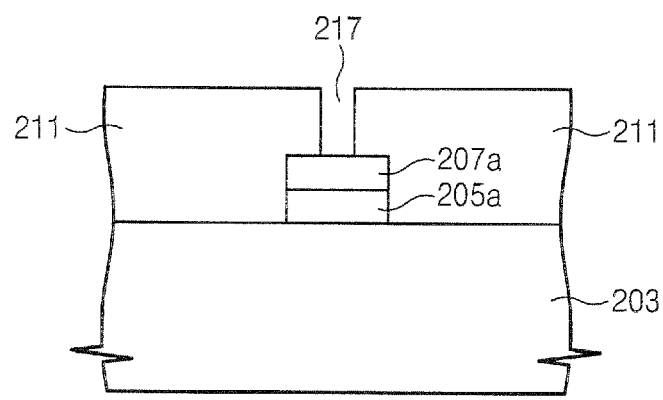

Referring to FIG. 4C, the exposed first conductive layer 205 outside the memory element pattern 207a is etched using the memory element pattern 207a as an etch mask, to form a first electrode 205a. The shapes of the first electrode 205a and the memory element pattern 207a are determined according to the memory array that will be employed. Therefore, if employing an cross-point resistive memory array, the memory element pattern 207a is formed in a shape of a line with a predetermined width extending in a first direction, and the first electrode 205a is also formed in a shape of a line extending in the first direction.

Subsequently, after forming a first photoimageable material layer 211, which is also an insulating layer 211, like in the first embodiment, the actinic irradiation and development processes are performed to an insulating layer 211 to form a contact hole 217 exposing a predetermined portion of the top surface of the memory element pattern 207a.

Figure 4D:
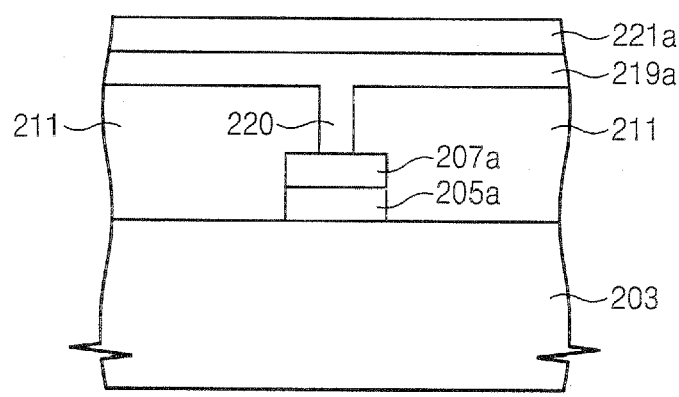

Referring to FIG. 4D, a second conductive layer for a second electrode is formed on the first photoimageable material layer 211 to fill the contact hole 217. A second photoimageable material layer is formed on the second conductive layer. Thereafter, the actinic irradiation and development processes are performed to form a second photoimageable material layer pattern 221a, which is also a memory element pattern. The second conductive layer is etched using the second photoimageable material layer pattern 221a as an etch mask to form a second electrode 219a. Herein, the shape of the second electrode 219a is determined according to the memory array to be employed. Therefore, in case of employing a cross-point resistive memory array, the second electrode 219a is formed in a shape of a line with a predetermined width extending in a second direction, and the second electrode 219a is connected to the memory element pattern 207a through a plug 220 that fills the contact hole 217. Herein, the second direction intersects the first direction.

Therefore, a unit resistive memory cell is formed at every intersection region of the second and first electrodes 219a and 215a in the cross-point memory array.

Meanwhile, if employing the cross-point memory array, it is possible to form multi-level cross-point memory array by stacking the structure configured with the first electrode, the memory element pattern and the second electrode, a plurality of times. It is preferable that the second photoimageable material layer pattern 221a be formed of a photoimageable switchable material layer capable of providing switching characteristic. The multilayered structure will be set forth with reference to FIG. 5 below.

Figure 5:
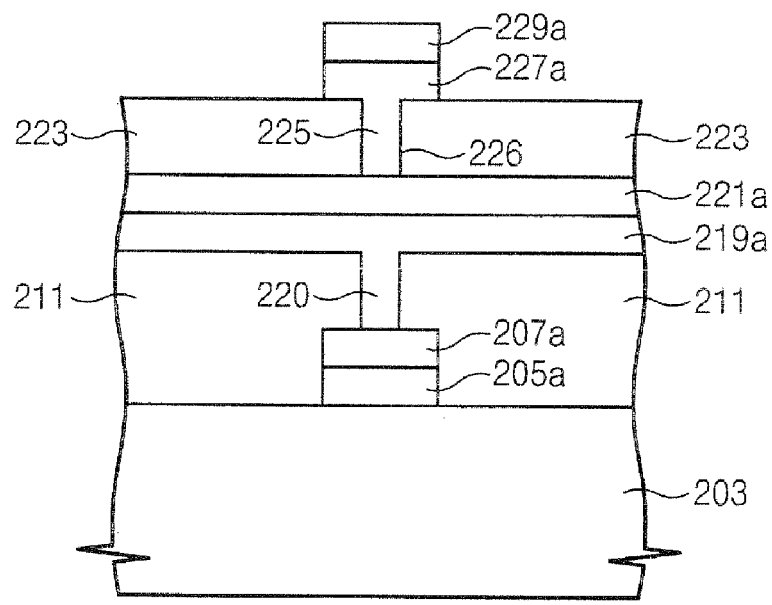
FIG. 5 is a cross-sectional view illustrating a portion of a multi-layered resistive memory array according to the third embodiment of the present invention.

Referring to FIG. 5, after forming the second electrode 219a and the memory element pattern 221a, a third photoimageable material layer 223 having a contact hole 226 is formed. Afterward, a third conductive layer and a photoimageable switchable material layer are formed on the resultant structure. The actinic irradiation process and the development process are performed to form an upper memory element pattern 229a extending in the first direction, and intersecting with the underlying memory element pattern 221a. The third conductive layer is etched using the upper memory element pattern 229a as an etch mask to form a third electrode 227a. The third electrode 227a is connected to the memory element pattern 221a through a plug 225 filling the contact hole 226.

Fourth Embodiment

A method of forming a resistive memory cell according to a fourth embodiment of the present invention will be illustrated with reference to FIG. 6A.

In the fourth embodiment, a planar polymer material layer 211 interposed between the second electrode 219a and the memory element pattern 207a is employed. In particular, the planar polymer material layer 211 between the second electrode 219a and the memory element pattern 207a, i.e., the planar polymer material layer 211 where the second electrode 219a (FIG. 5) and the memory element pattern 207a are overlapped with each other, is very thin, with a thickness t.

Figure 6A:
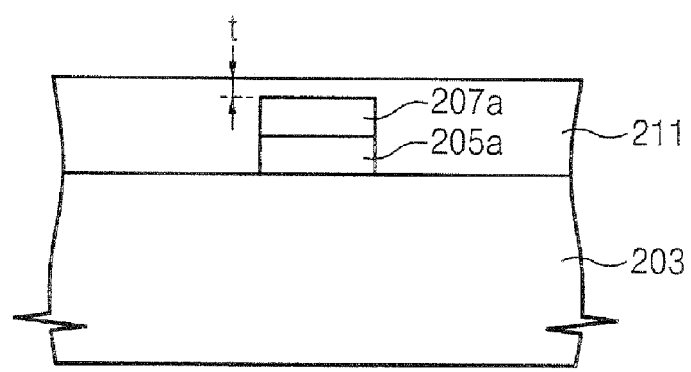
FIGS. 6A and 6B are cross-sectional views illustrating a method of forming a resistive memory cell according to a fourth embodiment of the present invention.

Referring to FIG. 6A, as in the third embodiment, a first electrode 205a and a memory element pattern 207a are formed on a substrate 203. Thereafter, the planar polymer material layer 211 is formed on the substrate 203 to cover the first electrode 205a and the memory element pattern 207a.

At this time, the planar polymer material layer 211 is formed by spin coating so that its top surface is planarized. Therefore, there is no need to perform an additional planarizing process. Meanwhile, the planar polymer material layer 211 is formed so that it is very thin when measuring the thickness at the top surface of the memory element pattern 207a. The thickness of the planar polymer material layer 211 is determined so that it does not effect the switching characteristic of the resistive memory cell defined at the intersection region of the first electrode 205a and a second electrode 219a that will be formed in a following process.

Figure 6B:
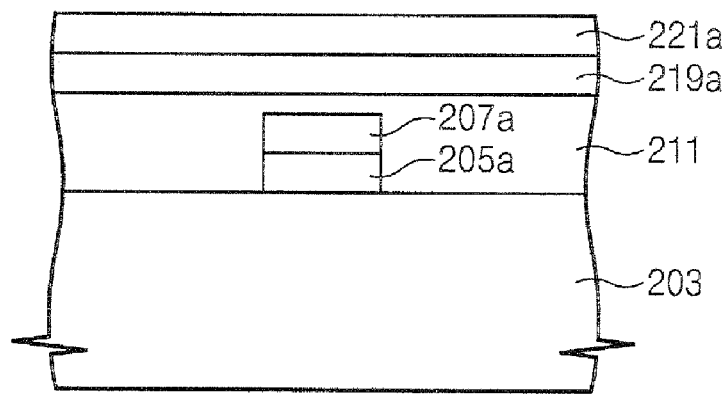

Referring to FIG. 6B, a second conductive layer for a second electrode and a photoimageable switchable material layer are formed on the planar polymer material layer 211 in sequence. The actinic irradiation process and the development process are performed over the photoimageable switchable material layer to form a photoimageable switchable pattern 221a. Thereafter, the exposed second conductive layer is etched using the photoimageable switchable pattern 221a as an etch mask to form a second electrode 219a.

Figure 7:
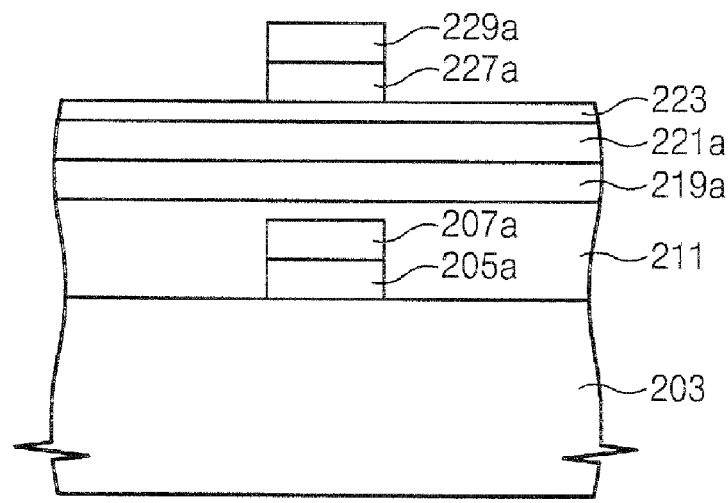
FIG. 7 is a cross-sectional view illustrating a portion of multi-layered cross-point memory array according to the present invention.

In the fourth embodiment, if the first electrode 205a and the memory element pattern 207a are formed in shapes of lines extending in the first direction, and the second electrode 219a is formed in a shape of a line extending in the second direction intersected with the first direction, this memory cell structure will be adaptable to the cross-point memory array. At this time, it is possible to form a multi-level cross-point memory array by stacking the structure configured with the first electrode, the memory element pattern, and the second electrode, a plurality of times. A sectional structure for this multi-level memory array is illustrated in FIG. 7. Referring to FIG. 7, after forming the second electrode 219a and the memory element pattern 221a, a planar polymer material layer 223 is formed again on the resultant structure. Thereafter, a conductive layer for a third electrode, and a photoimageable switchable material layer for a memory element pattern are formed. The actinic irradiation process and the development process are performed over the photoimageable switchable material layer to form an upper memory element pattern 229a extending in the first direction. Afterwards, the conductive layer is etched using the upper memory element pattern 229a as an etch mask to form a third electrode 227a extending in the first direction.

As described above, the memory cell structure and the manufacturing method illustrated in the third and fourth embodiments may be applied to a method of forming a cross-point memory array.

Memory Array

Fifth Embodiment

Figure 8:
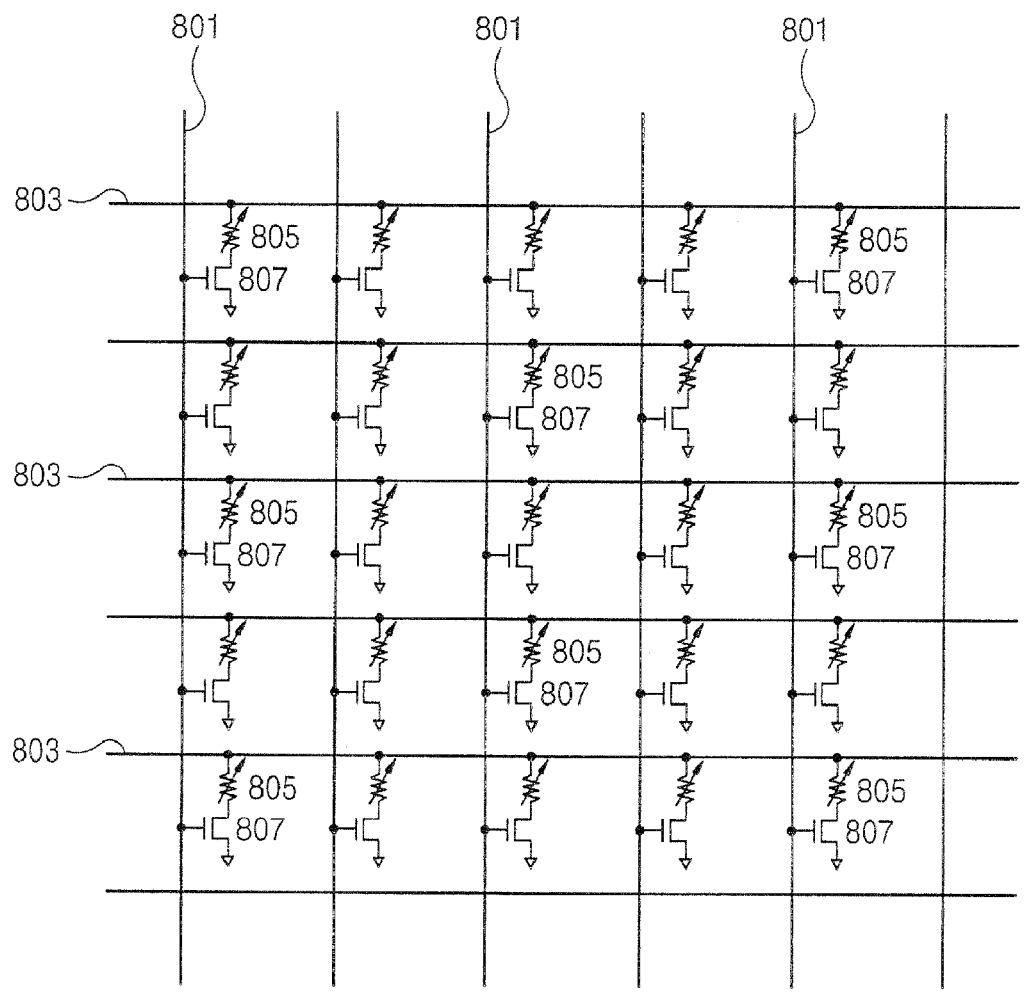
FIG. 8 is an equivalent circuit diagram of a memory array which is more adaptive for the method of forming a resistive memory cell illustrated with reference to FIGS. 2A to 2E and FIGS. 3A and 3B, and a memory cell structure so formed.

FIG. 8 is an equivalent circuit diagram of a memory array which is more adaptive for the method of forming the resistive memory cell illustrated with reference to FIGS. 2A to 2E and FIGS. 3A and 3B, and the memory cell structure so formed. Referring to FIG. 8, a plurality of resistive memory cells 805 are two-dimensionally arranged in a matrix of rows and columns. A second electrode 119a (i.e., FIGS. 2E and 3B) of the resistive memory cell 805 arranged in a row direction is connected to a same bit line 803. One terminal, i.e., a first electrode 105, of each resistive memory cell 805 is connected to a drain of a select transistor 807. A source of the select transistor 807 is connected to a source line applying a ground voltage, and a gate of the select transistor 807 is extended in a column direction to act as a word line 801.

Therefore, by applying a word line voltage higher than a threshold voltage capable of turning on the select transistor 807 to the gate acting as the word line 801 and applying a program bit line voltage having an appropriate polarity and magnitude to the bit line 803, the resistive memory cell at a cross-point of the bit line and word line enters a low resistance state (set-state) or a high resistance state (reset-state). Meanwhile, when applying a read bit line voltage to the bit line 803, information stored at a selected resistive memory cell is determined to be data '0' or '1' based on the magnitude of the current flowing through the resistive memory cell.

Figure 9A:
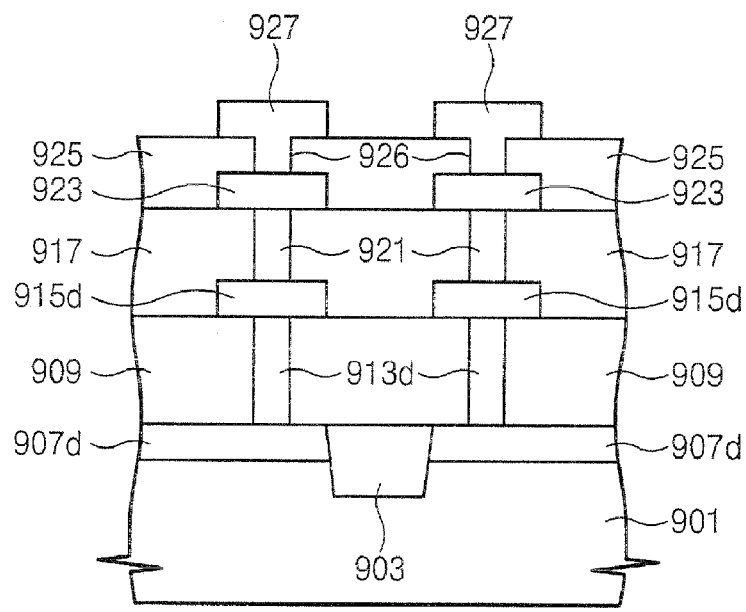
Figure 9B:
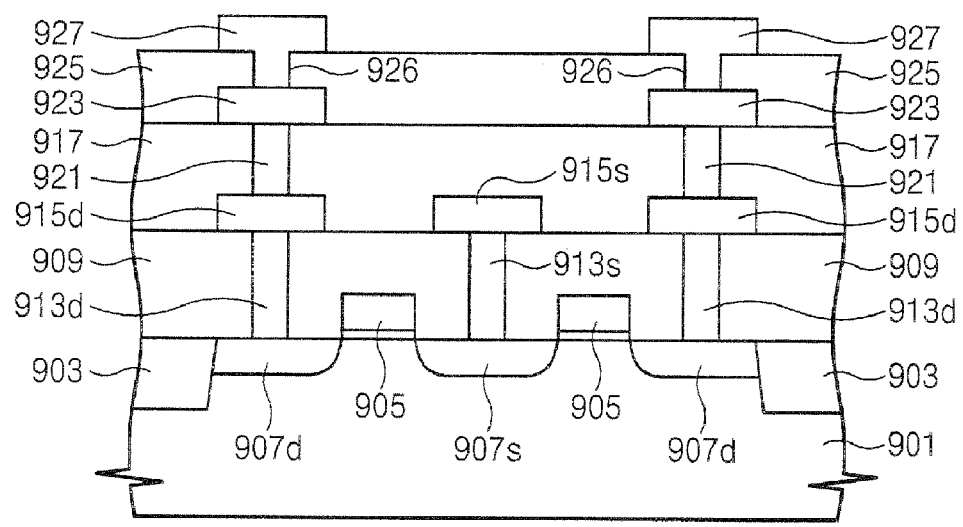

FIGS. 9A and 9B are cross-sectional views of a memory array employing the memory cell of FIGS. 4A to 4D, wherein FIG. 9A is a cross-sectional view taken along a first direction, which corresponds to the word line of FIG. 8, and FIG. 9B is a cross-sectional view taken along a second direction, which corresponds to the bit line of FIG. 8.

Referring to FIGS. 9A and 9B, an isolation layer 903 is formed on a substrate 901. The isolation layer 903, for example, may be formed by a conventional method using a shallow trench isolation (STI) technique. The substrate 901 surrounded by the isolation layer 903 is referred to as an active region, in which electrical interconnections are formed. A gate 905 acting as a word line is disposed on the active region and isolation layer 903, and a source 907s and a drain 907d are formed in the active region on both sides of the gate 905. Two neighboring gates arranged in a bit line direction share the source 907s commonly. The gate 905, the source 907s, and the drain 907d constitute a select transistor. This select transistor is formed by a conventional MOS process.

A first insulating layer 909 is formed on the substrate 901 for insulating the select transistor. The first insulating layer 909 is formed using a well-known thin film deposition process. For instance, the first insulating layer 909 is formed of various kinds of silicon oxide layers or a combination of a silicon oxide layer and a silicon nitride layer. The source 907s of the select transistor is connected to a source line 915s through a source plug 913s penetrating the first insulating layer 909. Meanwhile, the drain 907d of the select transistor is connected to a drain contact pad 915d through a drain plug 913d penetrating the first insulating layer 909. The gate 905 and the source line 915s are formed in shapes of lines extending in the same direction. The source line 915s and the drain contact pad 915d may be formed by performing processes of forming a contact hole, depositing a conductive material, and patterning the deposited conductive material.

A second insulating layer 917 is formed on the first insulating layer 909 for insulating the drain contact pad 915d and the source line 915s. The second insulating layer 917 may be formed of the same material as the first insulating layer 909.

A lower electrode 921 of the resistive memory cell has a shape of a contact plug so that it penetrates the second insulating layer 917 to be connected to the drain contact pad 915d. The lower electrode 921 is connected to the drain 907d of the select transistor through the drain contact pad 915d and the drain contact plug 913d. The lower electrode 921 may be formed by performing processes of patterning the second insulating layer 917 to form a contact hole, and subsequently filling the contact hole with a conductive material.

A memory element pattern 923, which is connected to the lower electrode 921, is formed on the second insulating layer 917. The memory element pattern 923 is arranged so that it is spaced apart from a neighboring memory element pattern. A photoimageable third insulating layer 925 is formed on the memory element pattern 923 and the second insulating layer 917, and is directly patterned by actinic irradiation and the development to form a contact hole 926 in the photoimageable third insulating layer 925. An upper electrode 927 is disposed on the photoimageable third insulating layer 925 while filling the contact hole 926. Although it is not shown in the drawings, the upper electrodes arranged in the second direction may be connected to a corresponding bit line.

Figure 10A:
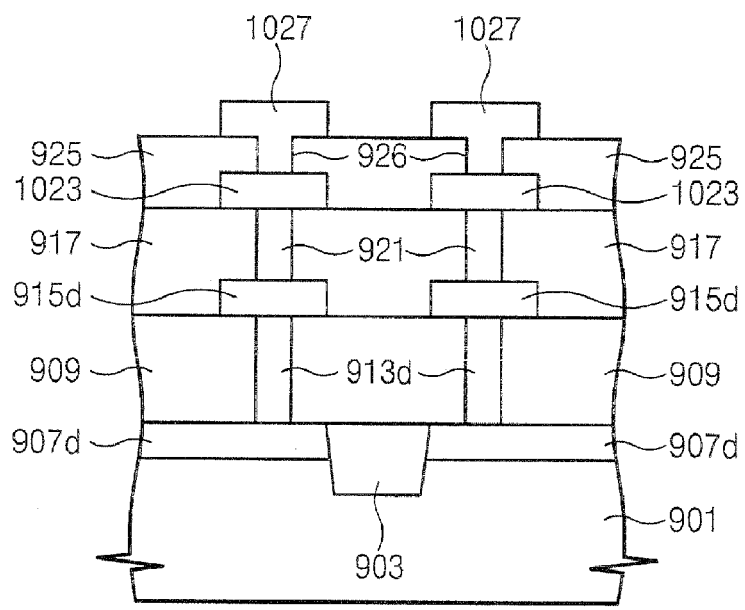
FIGS. 10A and 10B are cross-sectional views of the memory cell of FIGS. 9A and 9B when an upper electrode is formed in a shape of a line.
Figure 10B:
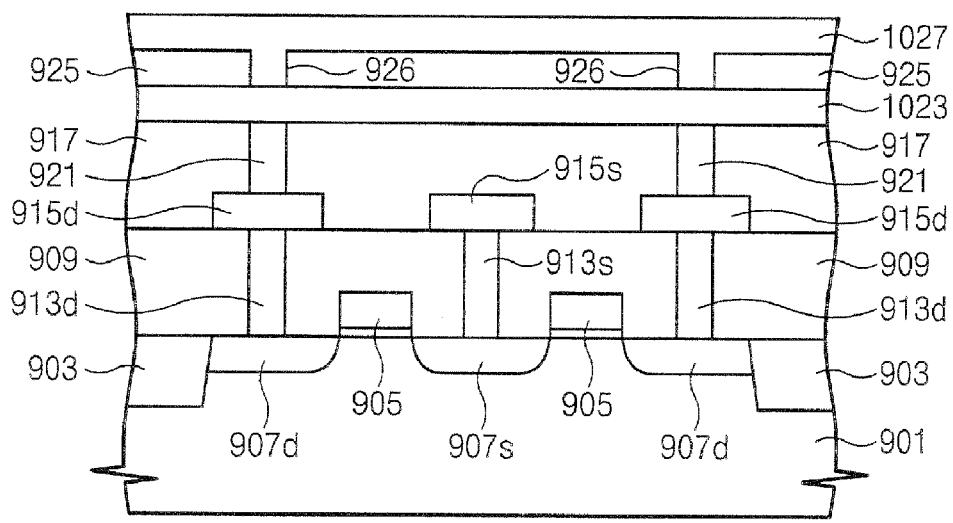

Meanwhile, as illustrated in FIGS. 10A and 10B, an upper electrode having a shape of a line extended in the second direction, itself, may serve a role of the bit line. Herein, a memory element pattern 1023 may be formed in a shape of a line extending in the second direction like the upper electrode 1027.

Furthermore, in the memory array of FIGS. 9A and 9B, the upper electrode 927 may not directly contact the memory element pattern 923. As illustrated in FIGS. 6A and 6B, a thin planar polymer material layer may be disposed between the upper electrode 927 and the memory element pattern 923.

Figure 11A:
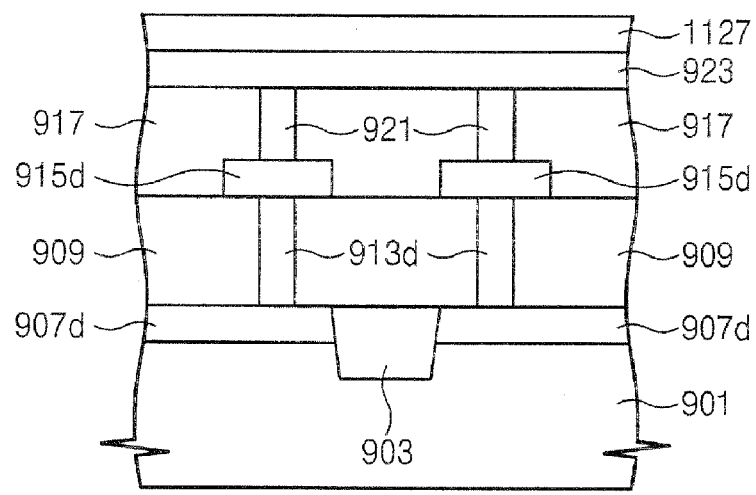
Figure 11B:
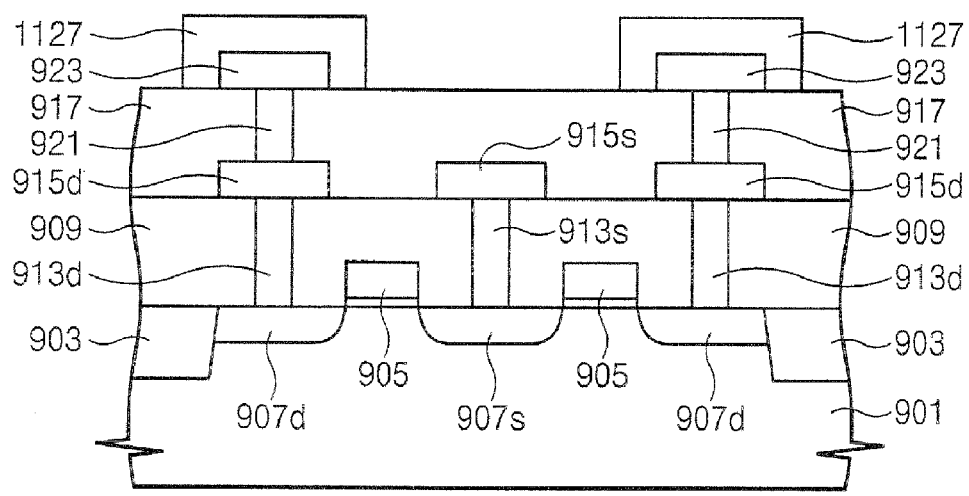

FIGS. 11A and 11B are cross-sectional views of a memory array employing the memory cell of FIGS. 5A to 5D, wherein FIG. 11A is a cross-sectional view taken along a first direction, which corresponds to the word line of FIG. 8, and FIG. 11B is a cross-sectional view taken along a second direction, which corresponds to the bit line of FIG. 8.

Referring to FIGS. 11A and 11B, the structure having elements formed from the substrate 901 to the memory element pattern 923 is identical to the structure of FIGS. 9A and 9B. An upper electrode 1127 is formed on the second insulating layer 917 to encompass the memory element pattern 923.

Figure 12:
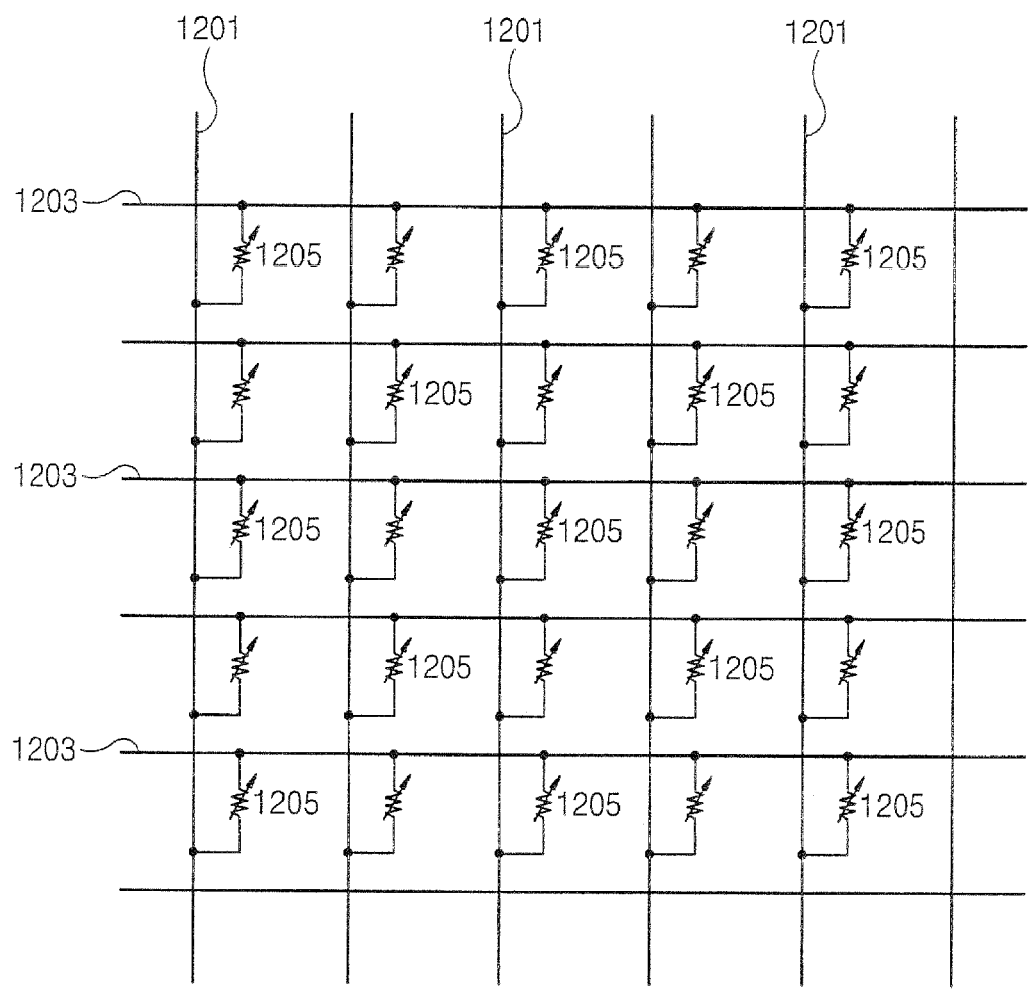
FIG. 12 is an equivalent circuit diagram illustrating a portion of a cross-point memory array not requiring a select transistor unlike the memory array of FIG. 8.

FIG. 12 is an equivalent circuit diagram illustrating a cross-point memory array not requiring a select transistor, as did the memory array of FIG. 8.

A plurality of word lines 1201 are arranged in a first direction, and a plurality of bit lines 1203 are arranged in a second direction. At every portion where the word line and the bit line intersect each other, a resistive memory element is formed. The word line 1201 corresponds to the first electrode 205a of FIGS. 4A to 4D, FIG. 5, FIGS. 6A and 6B, and FIG. 7, and the bit line 1203 corresponds to the second electrode 219a, for example.

A specific word line and a specific bit line are chosen to select a specific resistive memory element, which is defined at the portion where the selected word line and the selected bit line intersect each other. When applying a bit line voltage having an appropriate polarity and magnitude to a bit line and selecting an appropriate word line, the resistance of the resistive memory element 1205 formed at the intersection region of the selected bit line and word line is reversibly switched, or information stored at this resistive memory element 1205 is determined.

To prevent the leakage current from flowing into resistive memory cells adjacent to the selected resistive memory cell, the resistive memory cell array may further include a diode. The diode may be obtained by interposing an organic material doped with impurities between the first electrode and the memory element pattern, wherein a conductive type of the impurity is different from those of the first electrode and the memory element pattern.

Figure 13:
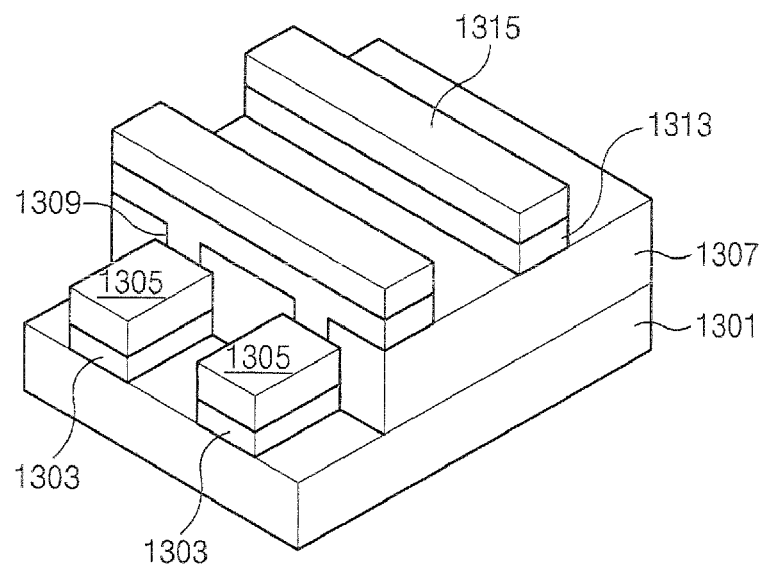
FIG. 13 is a perspective view illustrating a portion of the cross-point memory array using the memory cell of FIGS. 4A to 4D.

FIG. 13 is a perspective view illustrating a portion of the cross-point memory array using the memory cell of FIGS. 4A to 4D. Referring to FIG. 13, a plurality of first electrodes 1303, which are spaced apart from each other, are disposed on a substrate 1301, wherein the plurality of the first electrodes extend in a first direction. A photoimageable switchable memory element pattern 1305 is disposed on each first electrode 1303. An insulating layer 1307 having a plurality of contact holes 1309 therein exposing the top surface of each photoimageable switchable memory element pattern 1305, is disposed on the substrate 1301 to cover the first electrode 1303 and the photoimageable switchable memory element pattern 1305. A plurality of second electrodes 1313 extending in the second direction are disposed on the insulating layer 1307, filling the plurality of the contact holes 1309 arranged in the second direction. A memory element pattern 1315 is formed on each second electrode 1313.

Figure 14:
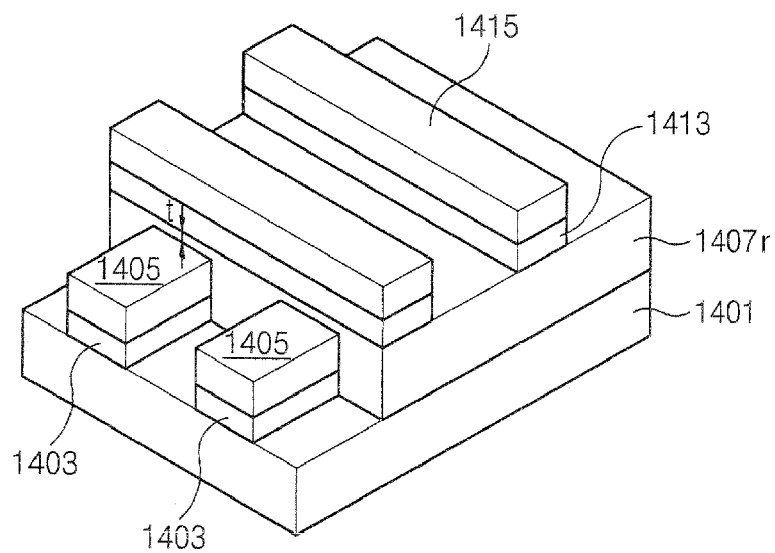
FIG. 14 is a perspective view illustrating a portion of the cross-point memory array using the memory cell of FIGS. 6A and 6B.

FIG. 14 is a perspective view illustrating a portion of the cross-point memory array using the memory cell of FIGS. 6A and 6B. The cross-point resistive memory array of FIG. 14 is substantially identical to that of FIG. 13 except that the insulating layer 1307 having the contact holes 1309 is replaced by a planar polymer material layer 1407r which is relatively thinner than the insulating layer 1307. A memory element pattern 1415 is formed on each second electrode 1413. Photoimageable switchable memory element patterns 1405 are disposed on the first electrodes 1403. The thickness (t) of the planar polymer material layer 1407r is determined so that it does not effect the switching operation of the resistive memory cell defined at the region where the second electrode 1413 and the first electrode 1403 intersect each other. The planar polymer material layer 1407r may be formed by spin coating so that its top surface is planarized. Therefore, there is no need to perform an additional planarizing process.

EXPERIMENTAL EXAMPLES

Experimental Example 1

A photoimageable switchable memory element was fabricated using polymethylmethacrylate (PMMA), and $Cu(BF_4)_2$, and its switching characteristic was measured.

The PMMA reacted with a photosensitizer to form a photoimageable PMMA. After mixing $Cu(BF_4)_2$ of about 20% by weight with the photoimageable PMMA, they were completely resolved into tetra hydrofuran (THF) solvent to form a photoimageable switchable PMMA. After forming an aluminum lower electrode on a substrate, the prepared photoimageable switchable PMMA was coated on the substrate where the aluminum lower electrode was formed, by performing the spin-coating at 2,000 rpm for about 30 seconds. A bake process was performed at about 60° C. to complete a memory element thin film configured with the photoimageable switchable PMMA. An aluminum upper electrode was formed to complete a memory cell sample.

Figure 15:
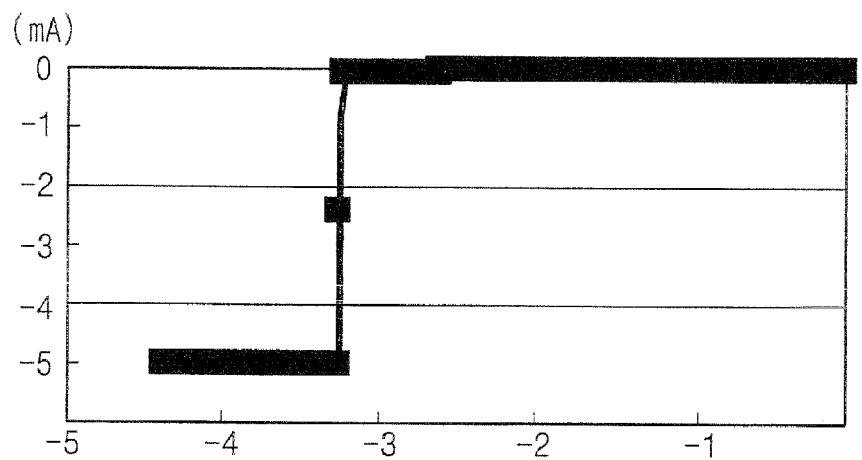
FIGS. 15 and 16 are graphs illustrating a switching characteristic of the memory cell according to one embodiment of the present invention.
Figure 16:
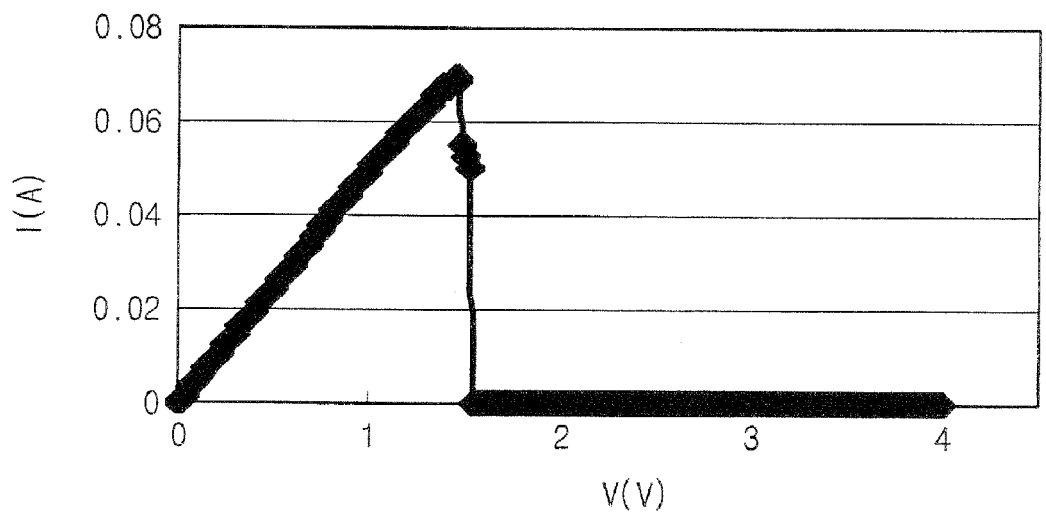

The switching characteristic was measured using the memory cell sample prepared as above, and the results are illustrated in FIGS. 15 and 16. In FIGS. 15 and 16, the horizontal axis and the vertical axis represent a voltage applied to the two electrodes of the memory cell, and a current flowing through the memory cell, respectively.

Referring to FIG. 15, when applying a positive voltage, e.g., about 3.5 V, to the two electrodes of the memory cell, the current abruptly increases. This means that the memory cell is switched to a low resistance state, i.e., a set-state.

Referring to FIG. 16, when applying a negative voltage, e.g., about −1.5 V, to the two electrodes of the memory cell, the current abruptly decreases. This means that the memory cell is switched to a high resistance state, i.e., a reset-state.

Figure 17:
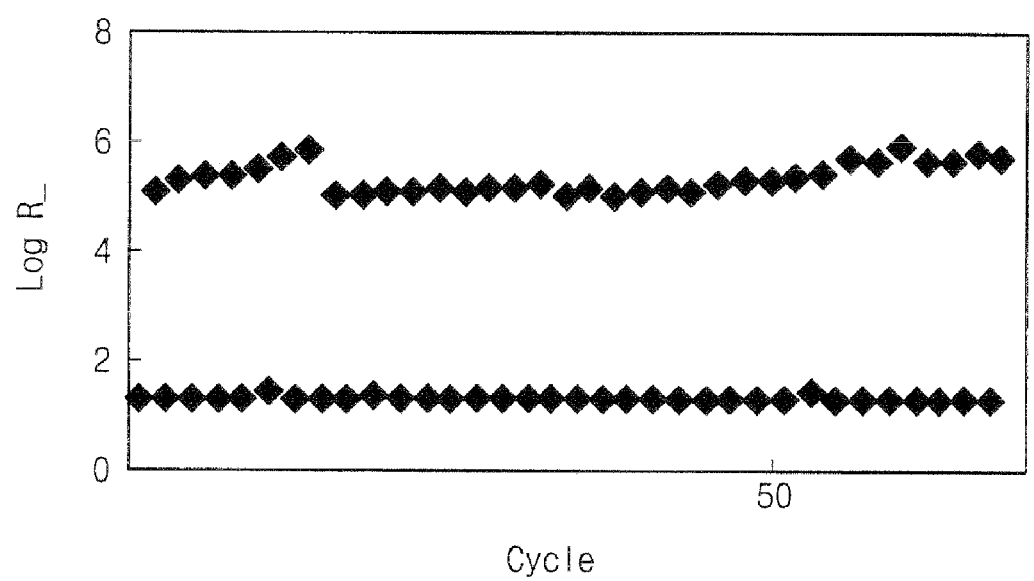
FIG. 17 is a graph illustrating a resistance distribution of the resistive memory cell as a switching operation is repeatedly performed over the memory cell according to one embodiment of the present invention.

Furthermore, to check out the endurance of the memory cell, this switching operation between the low resistance state and the high resistance state is performed many times, and these results are schematically illustrated in FIG. 17. The horizontal axis and the vertical axis of the graph in FIG. 17 represent the number of switching operations, and each resistance of the set-state and the reset-state in log scale, respectively.

Referring to FIG. 17, in spite of repeating switching operations, it can be seen that the resistance distributions in the set-state and the reset-state are excellently maintained.

Experimental Example 2

In a second experimental example, polyimide of a polymer material was used as a precursor to form a photoimageable switchable material. The polyimide may be formed by performing an imidization reaction for polyamic acid through a chemical or a thermal method, after fabricating the polyamic acid. Subsequently, the polyimide is reacted with the photosensitizer to fabricate a photoimageable polyimide. Upon an aluminum lower electrode formed by the same method used in the first experimental example, the photoimageable polyimide was formed tens of nanometers thick by spin-coating. Thereafter, a soft bake process was performed at about 150° C. for about 30 minutes. Thereafter, a curing process was performed at about 300° C. for about 30 minutes in nitrogen ambient to complete a polyimide layer. Afterward, an aluminum upper electrode was formed on the polyimide layer using the same method as the first experimental example.

The switching characteristic of the memory cell according to the second experimental example is similar to that of the first experimental example.

By the imidization reaction between the polyimide and the aluminum lower electrode thereunder during the curing process of the polyimide, a thin metal layer or a nanocluster layer of metal oxide is formed at an interface between the polyimide and the aluminum lower electrode. In this nanocluster layer or the thin metal layer, it is supposed that a switching operation be performed by means of charge-trapping when applying a voltage to the two aluminum electrodes. Otherwise, it is supposed that the switching operation is performed as the thin polyimide layer is electrostatically charged or discharged according to an electric field.

According to an embodiment of the present invention as stated above, the photoimageable switchable material is employed as the memory element, wherein the photoimageable switchable material has characteristics such that it can be directly patterned by actinic irradiation, and is reversibly switchable between the distinguishable resistance states by an applied voltage. Therefore, it is possible to effectively and simply implement the resistive memory device.

Additionally, according to the methods of the present invention, by adding a switching component into the material, which is well-known as the photoresist in the semiconductor fabrication process, it is possible to fabricate the photoimageable switchable material with ease.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A resistive memory cell comprising:
   a substrate;
   an insulating layer including a first electrode;
   a photoimageable switchable memory element pattern including a first and a second surface, formed by exposing and developing a photoimageable switchable material layer, and contacting the first electrode with the first surface; and
   a second electrode contacting the photoimageable switchable memory element pattern with the second surface.

2. The resistive memory cell of claim 1, wherein the photoimageable switchable material layer includes a photosensitizer and a material selected from the group consisting of tetracyanoquinodimethane, poly[3-(6-methoxyhexyl) thiopene], Rose Bengal, and poly(3,4-ethylenedioxythiophene).

3. The resistive memory cell of claim 1, wherein the photoimageable switchable material layer is a photoimageable polymer layer, in which at least one of a nanoparticle, a metal ion and a metal salt is uniformly dispersed.

4. The resistive memory cell of claim 3, wherein the nanoparticle includes
   a metallic nanoparticle being any one of aluminum, copper, nickel, iron, cobalt, gold, silver, magnesium, indium, calcium, lithium, and a conductive metallic oxide,
   a conductive polymer nanoparticle being one of 3,4-polyethylene dioxy-thiophenepolystyrene-sulfonate, and doped polyaniline,
   a conductive organic nanoparticle being any one of a buckminster fullerene, a dendrimer, and a carbon nanotube, or
   an organic/inorganic hybrid nanoparticle in which alkyl thiol encompasses the metallic nanoparticle, the conductive polymer nanoparticle, or the conductive organic nanoparticle.

5. The resistive memory cell of claim 3, wherein the photoimageable polymer layer includes
   an insulating polymer being any one of polyimide, polyamide, polymethylmethacrylate, poly benzoxazol, poly styrene, poly carbonate, polyolefin, polyester, polyurethane, polyacetal, polysilicon and poly sulfonate,
   or a semiconductor polymer being any one of poly (phenylenevinylene), poly thiophene, polyacetylene, poly(p-phenylene), polyaniline, poly-pyrrole, polyfluorene, poly(p-phenylene), a derivative thereof and a copolymer thereof.

6. The resistive memory cell of claim 1, wherein the photoimageable switchable material layer includes
   one selected from a group consisting of a nanoparticle layer, a metal ion layer, a metal salt layer, and a photoimageable polymer layer, or includes
   a combination layer of at least one layer of the nanoparticle layer, the metal ion layer, and the metal salt layer, and at least one layer of the photoimageable polymer layer.

7. The resistive memory cell of claim 6, wherein the nanoparticle layer includes
   a metallic nanoparticle being any one of aluminum, copper, nickel, iron, cobalt, gold, silver, magnesium, indium, calcium, lithium, and a conductive metallic oxide,
   a conductive polymer nanoparticle being one of 3,4-polyethylene dioxy-thiophenepolystyrene-sulfonate, and doped polyaniline, a conductive organic nanoparticle being any one of a buckminster fullerene, a dendrimer, and a carbon nanotube, or an organic/inorganic hybrid nanoparticle in which alkyl thiol encompasses the metallic nanoparticle, the conductive polymer nanoparticle, or the conductive organic nanoparticle.

8. The resistive memory cell of claim 1, further comprising a planar polymer layer between the second electrode and the photoimageable switchable memory element pattern.

9. The resistive memory cell of claim 8, wherein the planar polymer layer is an insulating polymer selected from the group consisting of polyimide, polyamide, polymethylmethacrylate, poly benzoxazol, poly styrene, poly carbonate, polyolefin, polyester, polyurethane, polyacetal, polysilicon, and poly sulfonate.

10. The resistive memory cell of claim 1, wherein the first electrode has a shape of a plug to fill a first contact hole formed in the insulating layer, and the second electrode covers the photoimageable switchable memory element pattern and the insulating layer.

11. The resistive memory cell of claim 1, further comprising a photoimageable material pattern including a second contact hole exposing the top surface of the photoimageable switchable memory element pattern, covering the photoimageable switchable memory element pattern and the insulating layer, wherein the first electrode has a shape of a plug to fill a first contact hole formed in the insulating layer, and the second electrode is disposed on the photoimageable material pattern while covering the second contact hole.

12. The resistive memory cell of claim 1, wherein one of the first and second electrodes and the photoimageable switchable memory element pattern have shapes of lines extending in a first direction, and the other of the first and second electrodes has a shape of a line extending in a second direction, the first direction intersecting the second direction.

13. The resistive memory cell of claim 12, further comprising a photoimageable material layer with a planarized top surface, covering one of the first and second electrodes that extends in the first direction and the photoimageable switchable memory element pattern, wherein one of the first and second electrodes that extends in the second direction is disposed on the photoimageable material layer, and is connected to the photoimageable switchable memory element pattern penetrating through the photoimageable material layer.

14. The resistive memory cell of claim 12, further comprising a planar polymer layer with a planarized top surface, covering one of the first and second electrodes that extends in the first direction and the photoimageable switchable memory element pattern, wherein one of the first and second electrodes that extends in the second direction is disposed on the planarized top surface.

15. The resistive memory cell of claim 1, further comprising an organic material doped with impurities disposed between the first electrode and the photoimageable switchable memory element pattern, wherein a conductive type of the impurity is different from those of the first electrode and the photoimageable switchable memory element pattern to form a photodiode.

16. A method of forming a resistive memory cell, the method comprising:

forming a first electrode on a substrate;
forming a photoimageable switchable memory element pattern; and
forming a second electrode on the photoimageable switchable memory element pattern.

17. The method of claim 16, wherein forming the photoimageable switchable memory element pattern comprises:
forming a photoimageable switchable material layer; and
exposing and developing the photoimageable switchable material layer.

18. The method of claim 17, wherein forming the photoimageable switchable material layer comprises:
preparing a photoimageable polymer by reacting a polymer material and a photosensitizer with each other;
preparing a photoimageable switching organic polymer by dispersing at least one of a nanoparticle, a metal ion, and a metal salt uniformly into the photoimageable polymer material; and
spin-coating the photoimageable switching organic polymer.

19. The method of claim 17, wherein forming the photoimageable switchable material layer comprises:
preparing a switching organic polymer by dispersing at least one of a nanoparticle, a metal ion, and a metal salt into a polymer material;
preparing a photoimageable switching organic polymer by mixing the switching organic polymer and a photosensitizer with each other; and
spin-coating the photoimageable switching organic polymer.

20. The method of claim 17, wherein forming the photoimageable switchable material layer comprises:
preparing a photoimageable switchable material by mixing the photoimageable polymer and a photosensitizer with each other; and
spin-coating the photoimageable switching organic polymer.

21. The method of claim 16, wherein forming the photoimageable switchable memory element pattern comprises:
forming a photoimageable material layer on the first electrode;
forming a nanocluster layer or a metal thin film at an interface between the photoimageable material layer and the first electrode by performing a heat treatment process; and
exposing and developing the photoimageable material layer.

22. The method of claim 16, wherein forming the photoimageable switchable memory element pattern comprises:
forming a photoimageable material layer and a metal thin film on the first electrode alternately at least one time; and
exposing and developing the photoimageable material layer.

23. The method of claim 16, further comprising forming a planar polymer material, after forming the photoimageable switchable memory element pattern and prior to forming the second electrode.

24. The method of claim 17, wherein forming the first electrode comprises:
forming an insulating layer including a first contact hole on the substrate; and
filling a first conductive material into the first contact hole, and wherein forming the second electrode comprises:
forming a photoimageable material layer including a second contact hole that exposes the photoimageable switchable memory element pattern on the insulating layer;

forming a second conductive layer for the second electrode in the contact hole and on the photoimageable material layer; and patterning the second conductive layer.

25. The method of claim 17, wherein forming the first electrode comprises:

forming an insulating layer including a first contact hole on the substrate; and filling a first conductive material into the first contact hole, and wherein forming the second electrode comprises:

forming a second conductive layer for the second electrode on the insulating layer and on the photoimageable switchable memory element pattern; and patterning the second conductive layer to form the second electrode so that the second electrode covers a top surface and a side surface of the photoimageable switchable memory element pattern.

26. The method of claim 17, wherein forming the first electrode comprises:

forming an insulating layer and a first conductive layer for the first electrode on the substrate; and patterning the first conductive layer by using the photoimageable switchable memory element pattern, and wherein forming the second electrode comprises:

forming a photoimageable material layer including a second contact hole exposing the photoimageable switchable memory element pattern on the insulating layer and on the photoimageable switchable memory element pattern;

forming a second conductive layer for the second electrode in the contact hole and on the photoimageable material layer; and patterning the second conductive layer.

27. The method of claim 17, wherein forming the first electrode comprises:

forming an insulating layer and a first conductive layer for the first electrode on the substrate; and patterning the first conductive layer by using the photoimageable switchable memory element pattern, and wherein forming the second electrode comprises:

forming a planar polymer layer and a second conductive layer for the second electrode; and patterning the second conductive layer.

28. A multi-level resistive memory array comprising:

multi-level electrode lines;

an insulating layer disposed between adjacent levels of the electrode lines, adjacent levels of electrode lines intersecting each other and electrode lines in the same level being substantially parallel; and a photoimageable switchable memory element line disposed between one of the electrode lines and the insulating layer, the photoimageable switchable memory element line being substantially the same shape as the one of the electrode lines.

29. The multi-level resistive memory array of claim 28, wherein the insulating layer is a planar polymer layer.

30. The multi-level resistive memory array of claim 28, wherein the insulating layer is a photoimageable material layer that includes a contact hole exposing the photoimageable switchable memory element pattern at portions where the electrode lines intersect each other, and the one of the electrode lines formed on the photoimageable material layer is connected to the photoimageable switchable memory element line by a filled contact hole of the photoimageable material layer.

* * * * *